(12) United States Patent
Okada et al.

(10) Patent No.: US 10,756,733 B2
(45) Date of Patent: Aug. 25, 2020

(54) TOUCH SENSOR UNIT AND MANUFACTURING METHOD THEREOF

(71) Applicant: MITSUBA Corporation, Gunma (JP)

(72) Inventors: Mitsuhiro Okada, Gunma (JP); Hideki Kubota, Gunma (JP); Minori Shoda, Gunma (JP); Koji Yamauchi, Gunma (JP); Yasuhiro Orihara, Gunma (JP); Takabumi Oikawa, Gunma (JP)

(73) Assignee: MITSUBA Corporation, Gunma (JP)

( * ) Notice: Subject to any disclaimer, the term of this patent is extended or adjusted under 35 U.S.C. 154(b) by 0 days.

(21) Appl. No.: 16/175,852

(22) Filed: Oct. 31, 2018

(65) Prior Publication Data

US 2019/0149151 A1 May 16, 2019

(30) Foreign Application Priority Data

Nov. 15, 2017 (JP) .................. 2017-219605

(51) Int. Cl.
| | |
|---|---|
| *H03K 17/96* | (2006.01) |
| *H01H 11/00* | (2006.01) |
| *H01H 3/02* | (2006.01) |
| *H01H 3/38* | (2006.01) |
| *H01H 3/14* | (2006.01) |
| *H03K 17/965* | (2006.01) |
| *H03K 17/975* | (2006.01) |
| *E05F 15/44* | (2015.01) |

(52) U.S. Cl.
CPC ............. *H03K 17/96* (2013.01); *E05F 15/44* (2015.01); *H01H 3/0213* (2013.01); *H01H 3/142* (2013.01); *H01H 3/38* (2013.01); *H01H 11/00* (2013.01); *H03K 17/965* (2013.01); *H03K 17/975* (2013.01); *E05Y 2900/531* (2013.01); *H01H 2003/0293* (2013.01)

(58) Field of Classification Search
CPC ........... H03K 17/96; E05F 15/44; H01H 3/38; H01H 11/00
USPC ......................................... 200/211
See application file for complete search history.

(56) References Cited

U.S. PATENT DOCUMENTS

| | | | | |
|---|---|---|---|---|
| 2013/0284576 | A1* | 10/2013 | Ishihara | ............ H03K 17/96 200/52 R |
| 2017/0052270 | A1* | 2/2017 | Schatz | .............. E05F 15/42 |

FOREIGN PATENT DOCUMENTS

JP          2013225477          10/2013

\* cited by examiner

*Primary Examiner* — Nguyen Tran
*Assistant Examiner* — Iman Malakooti
(74) *Attorney, Agent, or Firm* — JCIPRNET

(57) ABSTRACT

A first separator that prevents a pair of electrodes from short-circuiting each other is provided on end parts of the pair of electrodes in a longitudinal direction thereof, a first molded resin part that covers the first separator is provided on an end part of an insulation tube in a longitudinal direction thereof, a part of the first separator) on one side in a direction intersecting the longitudinal direction and another part of the first separator on the other side in the direction intersecting the longitudinal direction are each exposed to outside. When the first separator is embedded in the first molded resin part through insert molding, the first separator can be supported by a lower mold and an upper mold, portions of the first separator supported by the pair of molds at this time are portions exposed to outside.

2 Claims, 18 Drawing Sheets

TOUCH SENSOR UNIT AND MANUFACTURING METHOD THEREOF

CROSS-REFERENCE TO RELATED APPLICATION

This application claims the priority of Japan patent application serial no. 2017-219605, filed on Nov. 15, 2017. The entirety of the above-mentioned patent application is hereby incorporated by reference herein and made a part of this specification.

BACKGROUND

Technical Field

This disclosure relates to a touch sensor unit that is used to detect a contact of an obstacle and a manufacturing method thereof.

Description of Related Art

A conventional automatic opening/closing device provided in a vehicle like an automobile includes an opening/closing body for opening or closing an opening, an electric motor for driving the opening/closing body, and an operation switch for turning the electric motor on or off. Thus, the electric motor is driven when an operator operates the operation switch, and thereby the opening/closing body is driven to be opened or closed. In addition, the automatic opening/closing device may be designed to drive the opening/closing body under a condition other than an operation of the operation switch.

For example, the automatic opening/closing device may use a touch sensor unit to detect an obstacle being interposed between the opening and the opening/closing body. The touch sensor unit is fixed to the opening or the opening/closing body and detects a contact of an obstacle. In addition, the automatic opening/closing device drives the opening/closing body which has been driven to be closed to be opened or stops the opening/closing body that has been driven to be closed immediately on the basis of an input of a detection signal from the touch sensor unit, regardless of an operation of the operation switch.

An example of a touch sensor unit used in such an automatic opening/closing device is disclosed in Patent Document 1 (Japanese Laid-Open No. 2013-22547). A foreign object detection sensor (touch sensor unit) disclosed in Patent Document 1 includes a long hollow insulator (insulation tube), and two electrode wires that are provided in the insulator in a spiral shape. A terminal molding member (terminal part) is provided on a longitudinal end part of the hollow insulator, and a support member and a resistor (insertion component) are embedded in the terminal molding member. Here, the support member is used to hold end parts of the two electrode wires in an insulated state. In addition, the resistor is electrically connected to the end parts of the two electrode wires and is used to detect short-circuiting of the two electrode wires.

However, in the touch sensor unit disclosed in the above-described Patent Document 1, when the terminal part is subjected to insert molding or the like, the following problem may arise. That is, although the end part of the insulation tube in which insertion components are mounted is set in a mold, the insertion components are suspended since they are not supported by anything inside the molds at that time.

Accordingly, the insertion components may rattle inside the molds due to an injection pressure of a molten resin into the molds, and a problem such as misalignment of the insertion components in each product, peeling-off of solder, or the like can also arise.

SUMMARY

The disclosure provides a touch sensor unit and a manufacturing method thereof that can reduce variation in products and bring a satisfactory yield by improving the molding accuracy of a terminal part.

A touch sensor unit according to the disclosure is a touch sensor unit that is used to detect a contact of an obstacle including a hollow insulation tube that is elastically deformed by application of an external force, a plurality of electrodes that are provided in the insulation tube and come in contact with each other due to elastic deformation of the insulation tube, an insulation member that is provided at end parts of the plurality of electrodes in a longitudinal direction thereof and prevents the plurality of electrodes from short-circuiting each other, and a terminal part that is provided on an end part of the insulation tube in a longitudinal direction thereof and covers the insulation member, in which a part of the insulation member on one side in a direction intersecting the longitudinal direction thereof and another part of the insulation member on the other side in the direction intersecting the longitudinal direction thereof are each exposed to outside.

A manufacturing method of a touch sensor unit according to the disclosure is a manufacturing method of a touch sensor unit that is used to detect a contact of an obstacle, in which the touch sensor unit includes a hollow insulation tube that is elastically deformed by application of an external force, a plurality of electrodes that are provided in the insulation tube and come in contact with each other due to elastic deformation of the insulation tube, an insulation member that is provided on end parts of the plurality of electrodes in a longitudinal direction thereof and prevents the plurality of electrodes from short-circuiting each other, and a terminal part that is provided at an end part of the insulation tube in a longitudinal direction thereof and covers the insulation member, and the terminal part is formed through a first process of supporting a part of the insulation member on one side in a direction intersecting the longitudinal direction by a first mold, a second process of butting a second mold against the first mold and supporting another part of the insulation member on the other side in the direction intersecting the longitudinal direction thereof by the second mold, and a third process of flowing molten resin into an inside formed by the first mold and the second mold.

DESCRIPTION OF THE EMBODIMENTS

Embodiment 1 of the disclosure will be described in detail using the drawings.

Figure 1:
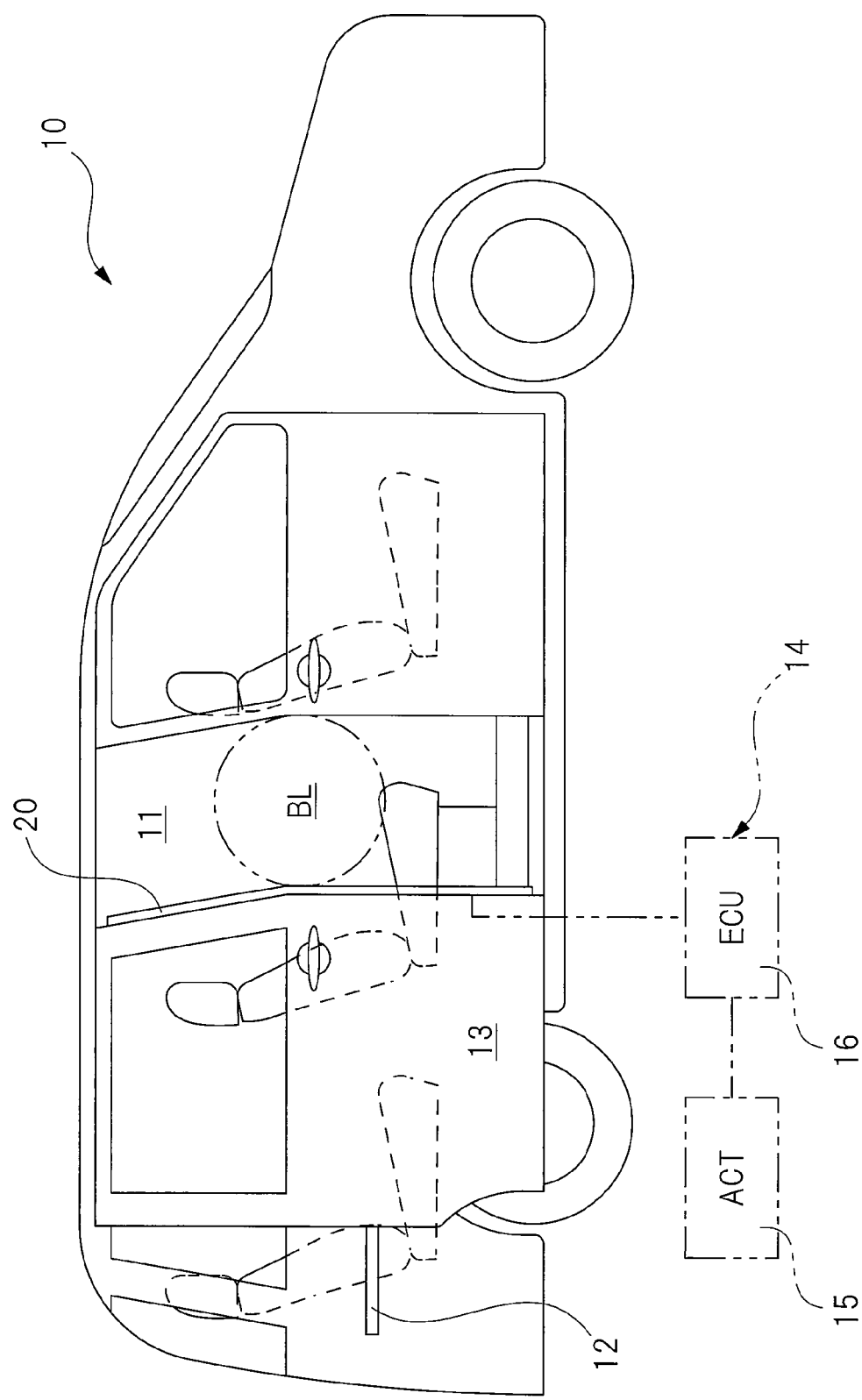
FIG. 1 is a side view illustrating a power sliding door (PSD) of a vehicle.
Figure 2:
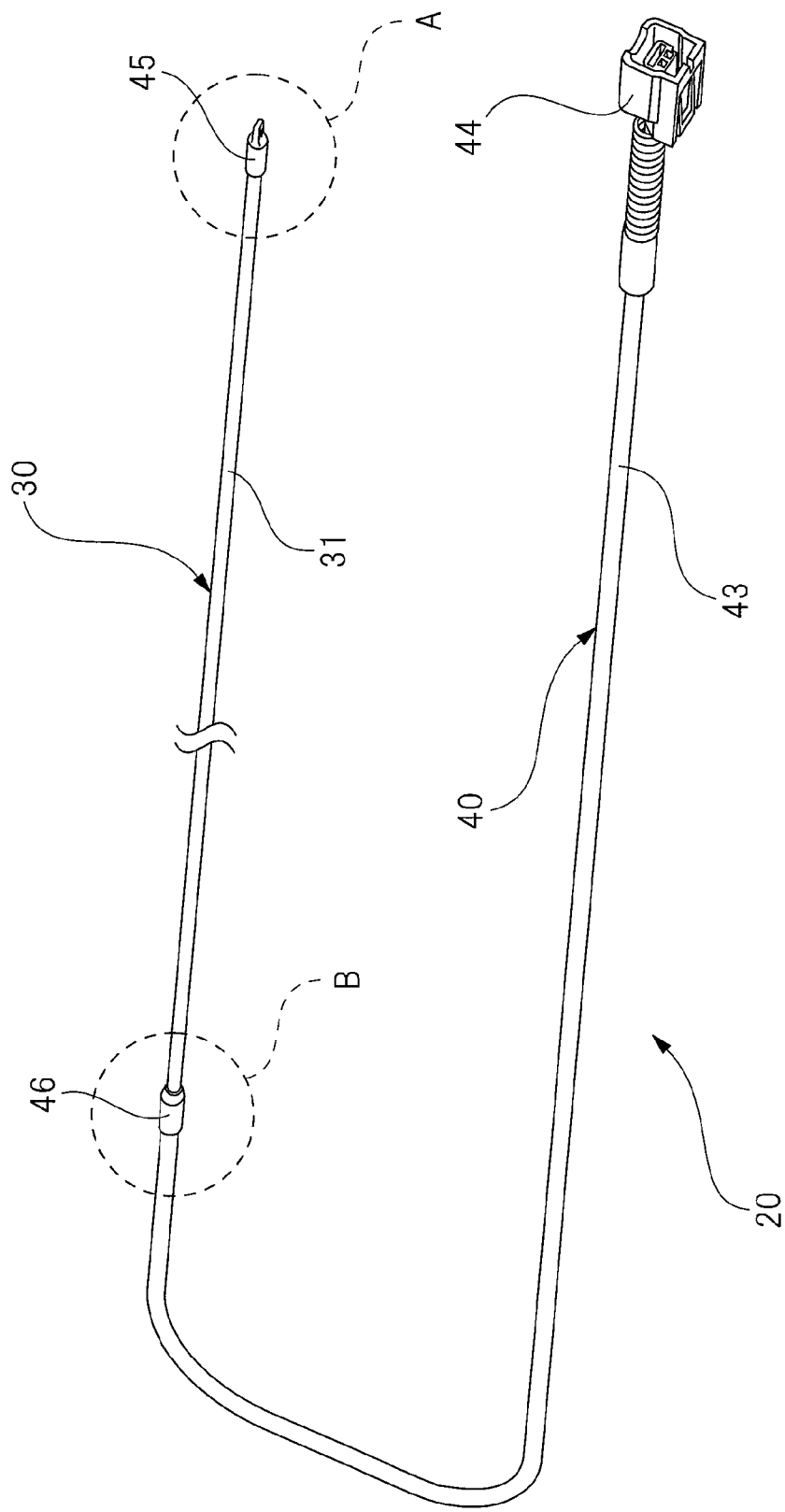
FIG. 2 is a perspective view illustrating a touch sensor unit for the PSD of FIG. 1.
Figure 3:
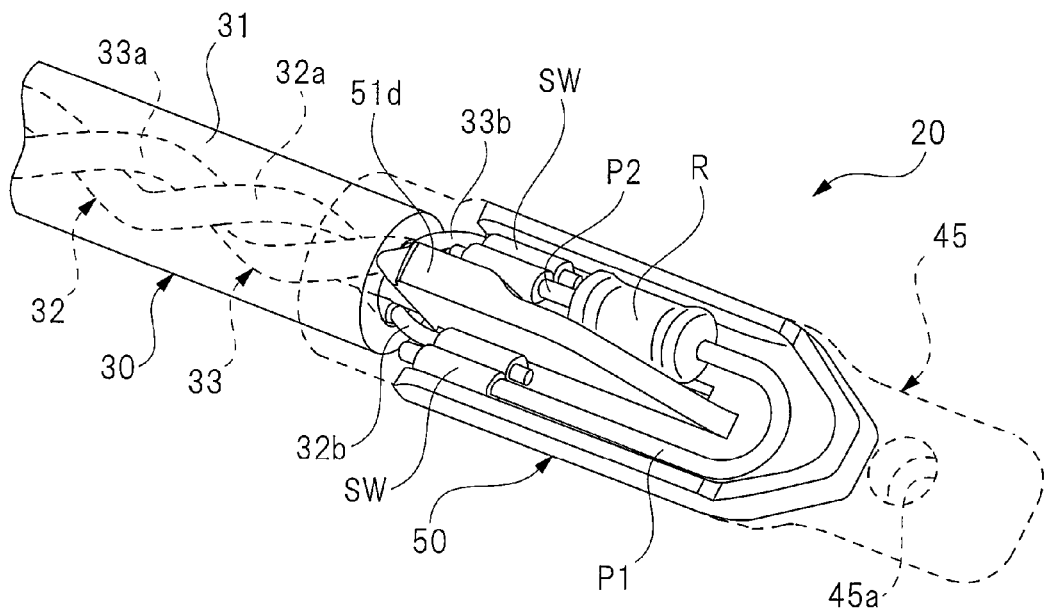
FIG. 3 is a perspective view in which the portion of the dashed circle A of FIG. 2 is enlarged.
Figure 4:
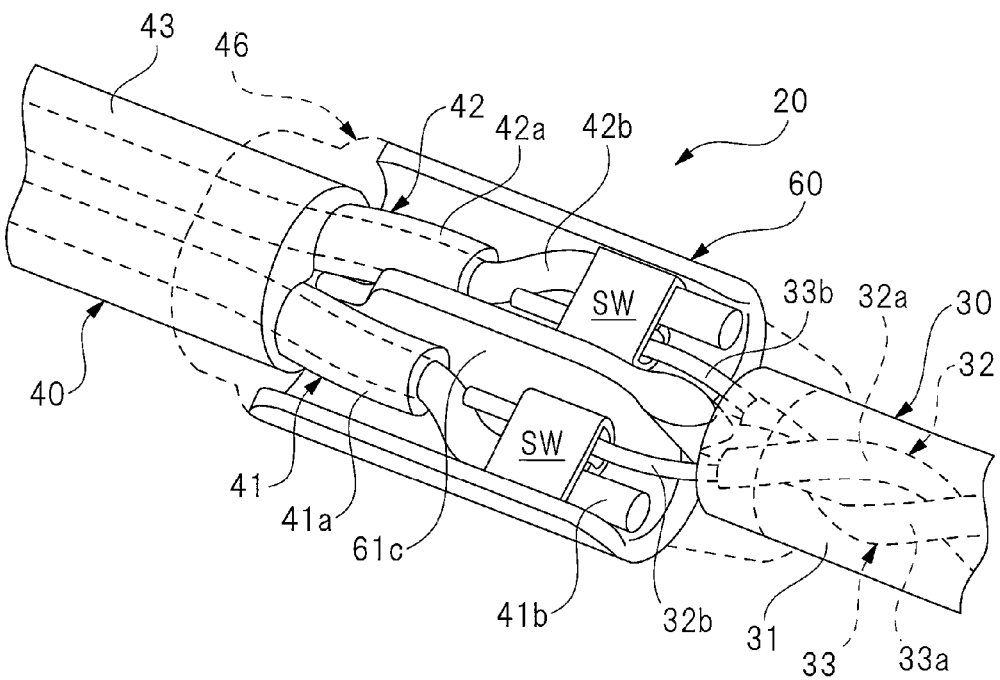
FIG. 4 is a perspective view in which the portion of the dashed circle B of FIG. 2 is enlarged.
Figure 5A:
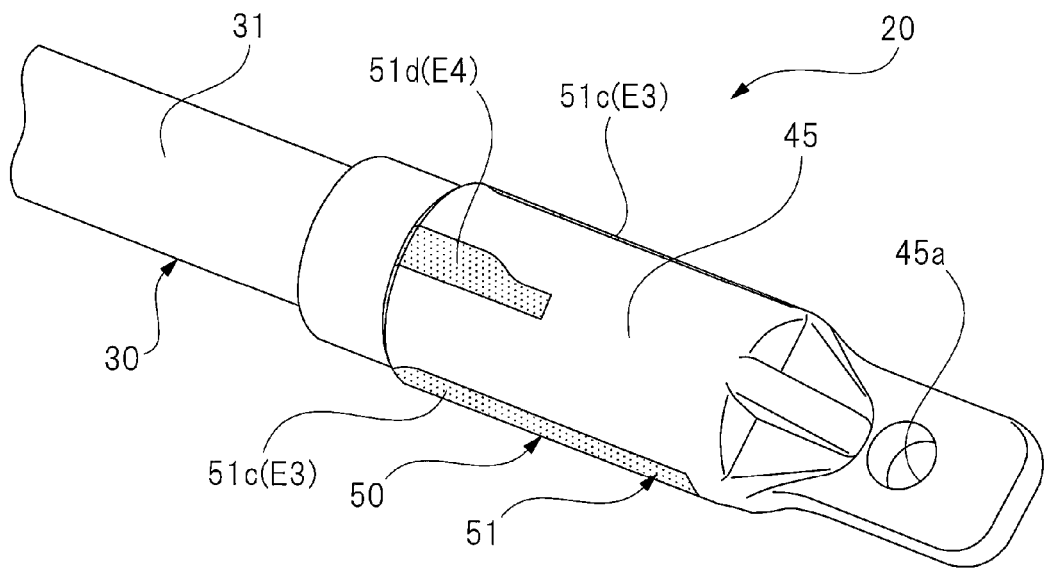
FIG. 5(a) and FIG. 5(b) are perspective views illustrating appearances of the first terminal part of FIG. 3.
Figure 6A:
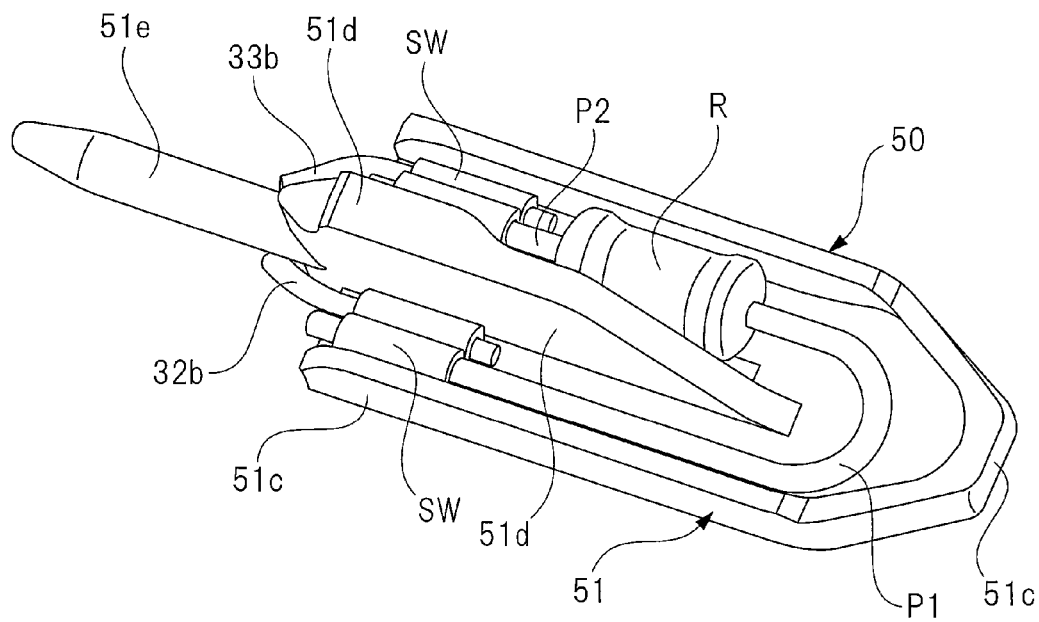
FIG. 6(a) and FIG. 6(b) are perspective views illustrating a first separator.

FIG. 1 is a side view illustrating a power sliding door (PSD) of a vehicle, FIG. 2 is a perspective view illustrating a touch sensor unit for the PSD of FIG. 1, FIG. 3 is a perspective view in which the portion of the dashed circle A of FIG. 2 is enlarged, FIG. 4 is a perspective view in which the portion of the dashed circle B part of FIG. 2 is enlarged, FIG. 5(*a*) and FIG. 5(*b*) are perspective views illustrating appearances of the first terminal part of FIG. 3, FIG. 6(*a*) and FIG. 6(*b*) are perspective views illustrating a first separator, FIG. 7(*a*) and FIG. 7(*b*) are perspective views illustrating appearances of the second terminal part of FIG. 4, and FIG. 8(*a*) and FIG. 8(*b*) are perspective views illustrating a second separator.

A vehicle 10 illustrated in FIG. 1 is a so-called minivan-type vehicle, and an opening part 11 through which passengers get on or off the vehicle or big luggage is loaded or unloaded is formed on a side part of the vehicle 10. The opening part 11 is opened or closed by a sliding door (an opening/closing body) 13 that moves in the front-rear direction (the left-right direction in the drawing) of the vehicle 10 via a guide mechanism (details thereof are not illustrated) including a guide rail 12 and the like provided on a side part at a rear side of the vehicle 10.

In addition, a power sliding door (PSD) device 14 is mounted in the vehicle 10. The power sliding door device 14 includes an actuator (ACT) 15 with a speed reducer that opens or closes the sliding door 13, a controller (ECU) 16 that controls the actuator 15 on the basis of operation signals of an operation switch (not illustrated), and a touch sensor unit 20 for one PSD that detects a contact of an obstacle BL. Note that PSD is an abbreviation for Power Sliding Door.

The touch sensor unit 20 for a PSD is provided on a vehicle front side (the right side in the drawing) of the sliding door 13 which is a fixation object. More specifically, the touch sensor unit 20 for a PSD is mounted in the sliding door 13 at an end part at the vehicle front side in a curved shape. That is, the touch sensor unit 20 for a PSD is in a curved state along the curved shape of a door frame and is fixed to the sliding door 13 in a curved state.

Accordingly, when an obstacle BL comes in contact with the touch sensor unit 20 for a PSD between the opening part 11 and the sliding door 13, a sensor unit 30 (see FIG. 2) forming the touch sensor unit 20 for a PSD is elastically deformed immediately.

In addition, the touch sensor unit 20 for a PSD is electrically connected to the controller 16, and a detection signal generated when the sensor unit 30 is elastically deformed is input to the controller 16. The controller 16 drives the sliding door 13 which has been driven to be closed to be opened or stops the sliding door 13 that has been driven to be closed immediately on the basis of the input of the detection signal from the touch sensor unit 20 for a PSD, regardless of an operation of the operation switch. Accordingly, insertion of the obstacle BL can be prevented in advance.

Here, as illustrated in FIG. 3, a pair of electrodes 32 and 33 are provided in the sensor unit 30, and a resistor R is electrically connected to tip sides thereof (the right side in the drawing). Accordingly, in a state in which the sensor unit 30 is not elastically deformed, the pair of electrodes 32 and 33 are not in contact with each other, and the controller 16 receives an input of a resistance value of the resistor R. That is, the controller 16 determines that there is no insertion of an obstacle BL when the resistance value of the resistor R is input, and thus continuously executes closing driving of the sliding door 13.

On the other hand, when an obstacle BL is brought in contact with the touch sensor unit 20 for a PSD and thus the sensor unit 30 is elastically deformed, the pair of electrodes 32 and 33 are brought in contact with each other and short-circuit. Then, the controller 16 receives an input of a resistance value (infinite) not via the resistor R. Accordingly, the controller 16 detects a change in the resistance value and controls whether to drive the sliding door 13 to be opened or stop the sliding door 13 immediately using the change of the resistance value as a trigger.

As illustrated in FIG. 2 to FIG. 4, the touch sensor unit 20 for a PSD is formed in a long string shape and includes the sensor unit 30 that is elastically deformed due to contact with the obstacle BL (see FIG. 1) and a wiring part 40 for electrically connecting the sensor unit 30 to the controller 16 (see FIG. 1). Note that the portion of the dashed circle B is the boundary portion between the sensor unit 30 and the wiring part 40.

As illustrated in FIG. 3 and FIG. 4, the sensor unit 30 includes an insulation tube 31 forming the outer shell of the sensor unit. The insulation tube 31 is formed by cutting a rubber tube having flexibility or the like into a predetermined length and is elastically deformed when an external force of a predetermined magnitude is applied thereto. The pair of electrodes 32 and 33 are fixed to an inner side (inside) of the insulation tube 31 in the radial direction in a spiral shape in a state where the electrodes are not in contact with each other. These electrodes 32 and 33 include conductive tubes 32*a* and 33*a* formed of a conductive rubber having flexibility or the like, and conductive lines 32*b* and 33*b* formed by bundling a plurality of copper wires are each provided inside the tubes.

Here, the size of the inner diameter of the insulation tube 31 is set to be about three times larger than the size of the diameter of the pair of electrodes 32 and 33. Accordingly, a clearance small enough for about one electrode to be inserted thereinto is formed between the pair of electrodes 32 and 33 that are disposed to face each other having the axis of the insulation tube 31 as the center. Accordingly, the pair of electrodes 32 and 33 are designed to be brought in contact with each other and short-circuit under substantially the same conditions (pressing force) even if the obstacle BL (see FIG. 1) comes in contact with therewith at any position in the circumferential direction on the insulation tube 31 (the sensor unit 30).

Note that, in the touch sensor unit 20 for a PSD used in the sliding door 13 (see FIG. 1), the size of the diameter of the insulation tube 31 is set to about 5 mm. Thus, when handling or detection sensitivity of the touch sensor unit 20 for a PSD with respect to the sliding door 13 is considered, it is desirable to provide the pair of electrodes 32 and 33 having a diameter size of about 1 mm in a spiral shape inside the insulation tube 31.

In the present embodiment, for example, even when the sensor unit 30 is wound around a small diameter post having a radius of 4 mm, the pair of electrodes 32 and 33 do not short-circuit each other. On the other hand, in a case where four identical electrodes are provided in parallel inside the same insulation tube as a comparative example, for example, even if the sensor unit is wound around a large diameter post having a radius of 7.5 mm, each of the electrodes short-circuits.

In the present embodiment, that is, the configuration in which the pair of electrodes 32 and 33 are provided in a spiral shape inside the insulation tube 31 as described above, the mounting portion of the sliding door 13 curved in a relatively wide angle range from an acute angle to an obtuse angle can be easily dealt with.

In addition, one end part of the wiring part 40 in the longitudinal direction is electrically connected to the proximal end part (the left side in FIG. 2) of the sensor unit 30 in the longitudinal direction as illustrated in FIG. 2 and FIG. 4. The wiring part 40 includes a pair of wiring cords 41 and 42 and these wiring cords 41 and 42 are covered by a rubber tube 43 having flexibility. In addition, the pair of wiring cords 41 and 42 include insulation tubes 41*a* and 42*a*, respectively, and electrical wires 41*b* and 42*b* formed by bundling a plurality of copper wires are provided therein. Note that the rubber tube 43 is formed of the same rubber material as the insulation tube 31.

In addition, a male connector 44 into which a female connector (not illustrated) of the controller 16 (see FIG. 1) is inserted is provided on the other end part of the wiring part 40 in the longitudinal direction. Accordingly, a short circuit signal (a signal of a changed resistance value) from the sensor unit 30 is input to the controller 16 via the wiring part 40, and thereby the controller 16 senses insertion of the obstacle BL (see FIG. 1).

As illustrated in FIG. 3 and FIG. 5, a first molded resin part 45 that is a terminal part is integrally provided in the tip part of the sensor unit 30 (an end part in the longitudinal direction). The first molded resin part 45 protects the terminal of the sensor unit 30 and covers the tip end of the insulation tube 31 and the tip parts of the pair of electrodes 32 and 33. In addition, a first separator 50 that is an insulation member, one resistor R, and two caulking members SW are embedded in the first molded resin part 45 through insert molding. That is, the first molded resin part 45 covers the first separator 50.

Here, description of the first molded resin part 45 is omitted and the outline of the first molded resin part 45 is indicated by dashed lines in FIG. 3 in order to facilitate understanding of the inner structure of the first molded resin part 45.

As described above, the first molded resin part 45 prevents the tip parts of the insulation tube 31 and the pair of electrodes 32 and 33, most parts of the first separator 50 excluding a part thereof, the resistor R, and the pair of caulking members SW from being exposed to outside to protect these constituent components.

However, a part of the first separator 50 is exposed to outside as indicated by the shaded part of FIG. 5, and thus an unnecessary increase in the size of the first molded resin part 45 is avoided. Here, the portion of the first separator 50 exposed to outside does not affect its function and durability even if it is exposed to outside.

In addition, a long connection part P1 and a short connection part P2 are provided on both end parts of the resistor R as illustrated in FIG. 3. In addition, the long connection part P1 and the short connection part P2 are electrically connected to the conductive lines 32*b* and 33*b* of the pair of electrodes 32 and 33 via the pair of caulking members SW, respectively, by folding the long connection part P1 180 degrees with respect to the short connection part P2. In this way, the tip parts of the pair of electrodes 32 and 33 are electrically connected to each other via the resistor R.

Note that, since the pair of caulking members SW are caulked by a caulking jig (not illustrated) such as electrical pliers, the resistor R is thus electrically connected firmly to the conductive lines 32*b* and 33*b* of the pair of electrodes 32 and 33. In addition, the pair of caulking members SW are each disposed on both sides of the partition wall 51*d* of the first separator 50, and thus short-circuiting of the members is prevented.

Here, the first molded resin part 45 is formed by setting the tip part of the insulation tube 31 into which the first separator 50, the resistor R, and the like have been assembled in a lower mold 70 and an upper mold 80 (see FIG. 9) and injecting a molten rubber material or the like into these molds 70 and 80. That is, the constituent components including the first separator 50, the resistor R, and the like are embedded in the first molded resin part 45 through the insert molding.

In addition, the first molded resin part 45 is formed of the same rubber material as the insulation tube 31 having sufficient flexibility. However, for example, it can be formed of a rubber material with higher hardness than the insulation tube 31 in order to protect the first separator 50, the resistor R, and the like embedded in the first molded resin part 45 more reliably.

As illustrated in FIG. 5, the first molded resin part 45 is formed in a substantially cylindrical shape extending in the extension direction of the sensor unit 30. In addition, the proximal end part of the first molded resin part 45 in the longitudinal direction is integrated with the tip part of the insulation tube 31 while covering a part of the tip part of the insulation tube 31.

Meanwhile, a through hole 45*a* passing through the first molded resin part 45 in the transverse direction is provided on the tip part of the first molded resin part 45 in the longitudinal direction. The through hole 45*a* is designed to be engaged with a fixing part (not illustrated) provided on the sliding door 13 (see FIG. 1) side. Accordingly, the tip part of the sensor unit 30 is fixed to the sliding door 13 without rattling.

As illustrated in FIG. 6, the first separator 50 embedded in the first molded resin part 45 is formed in a predetermined shape using injection molding of a resin material such as plastic. The first separator 50 is provided on the tip parts of the pair of electrodes 32 and 33 in the longitudinal direction, prevents the pair of electrodes 32 and 33 from short-circuiting each other, and includes a housing body part 51 housing the resistor R and the pair of caulking members SW. The housing body part 51 is formed in a substantial bath tub shape, and a tip side (the right side in the drawing) thereof becomes tapered in the longitudinal direction.

Specifically, the housing body part 51 includes a first bottom wall part 51a disposed on its proximal end side in the longitudinal direction (the left side in the drawing) and a second bottom wall part 51b disposed on its tip side in the longitudinal direction. In addition, a side wall part 51c is integrally provided around the first bottom wall part 51a and the second bottom wall part 51b to stand up with respect to the first and second bottom wall parts 51a and 51b.

Note that the side wall part 51c is not provided on the proximal end side of the housing body part 51 in the longitudinal direction. That is, the proximal end side of the housing body part 51 in the longitudinal direction is open to the first separator 50 in the longitudinal direction. Accordingly, the conductive lines 32b and 33b of the pair of electrodes 32 and 33 (see FIG. 3) can be led to the pair of caulking members SW provided in the housing body part 51.

In addition, the partition wall 51d extending in the longitudinal direction of the first separator 50 is provided in the housing body part 51. The partition wall 51d divides the inside of the housing body part 51 into two in the transverse direction, and functions to prevent the pair of caulking members SW from short-circuiting. Furthermore, a height h1 of the partition wall 51d protruding from the first and second bottom wall parts 51a and 51b (see FIG. 9) is higher than a height h2 of the side wall part 51c protruding from the first and second bottom wall parts 51a and 51b (see FIG. 9) (h1>h2).

In addition, an insertion part 51e that is inserted into the tip part of the insulation tube 31 (see FIG. 3) is integrally provided on the conductive lines 32b and 33b side (the left side in the drawing) in the longitudinal direction of the partition wall 51d. The insertion part 51e extends in the longitudinal direction of the first separator 50, and is formed in a substantially cylindrical shape, and its tip side becomes tapered. Thus, the insertion part 51e can be easily inserted into the insulation tube 31.

More specifically, the insertion part 51e is inserted between the pair of electrodes 32 and 33 inside the insulation tube 31. Accordingly, the first separator 50 holding the resistor R and the pair of caulking members SW is held at the tip part of the insulation tube 31 without rattling.

Figure 6B:
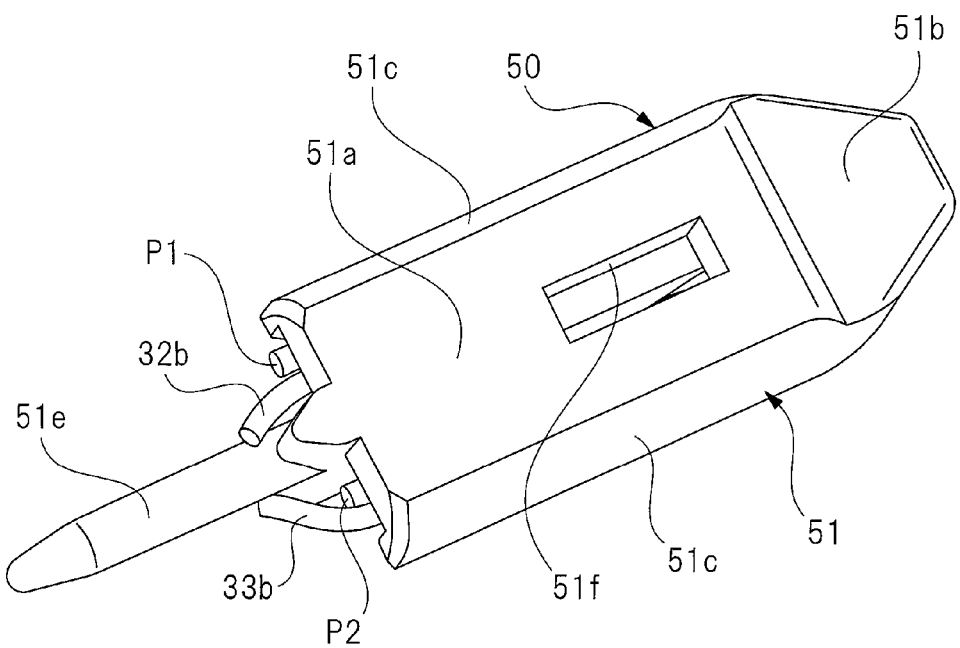
Figure 7A:
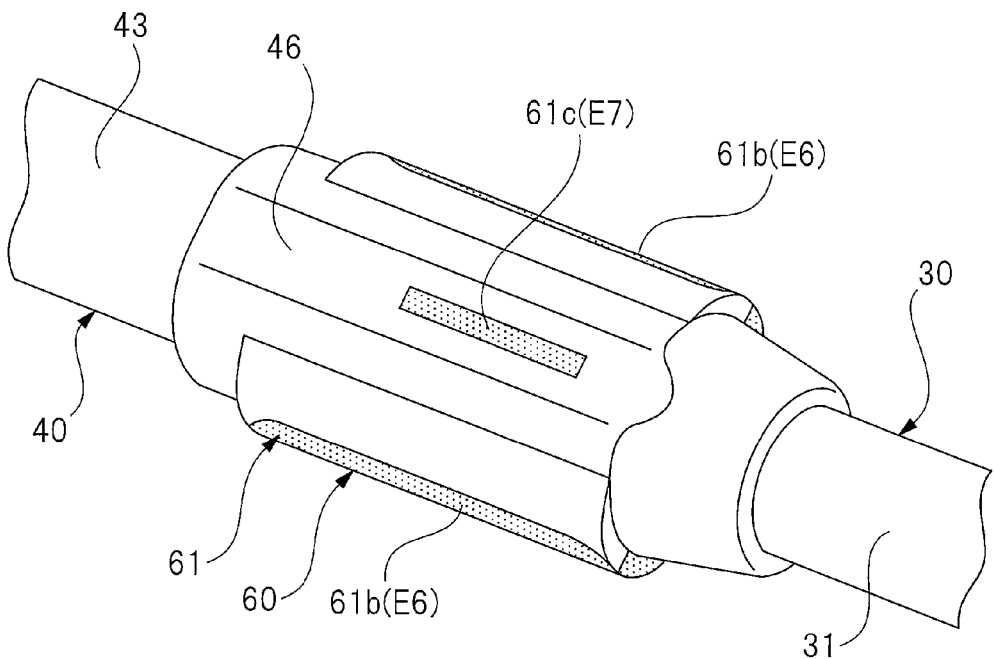
FIG. 7(*a*) and FIG. 7(*b*) are perspective views illustrating appearances of the second terminal part of FIG. 4.

A recess part 51f receding toward the inner side from the outer side of the housing body part 51 is provided in the first bottom wall part 51a as illustrated in FIG. 6(b). A cross-sectional shape of the recess part 51f is formed in a substantially rectangular shape. That is, the recess part 51f extends in a direction intersecting the longitudinal direction of the first separator 50, and a cross-section thereof in the longitudinal direction of the first separator 50 has a non-circular shape. Here, the recess part 51f constitutes an engagement part in the disclosure.

Figure 5B:
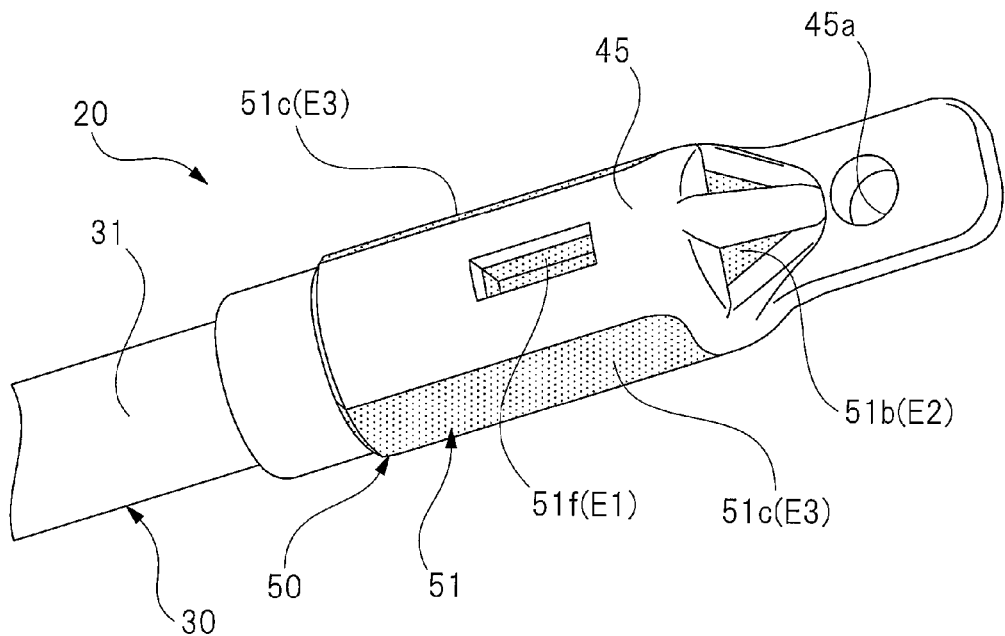

In addition, the recess part 51f of the first separator 50 is exposed to outside as indicated by the shaded part of FIG. 5(b) in the state in which the first separator 50 is embedded in the first molded resin part 45. Here, the portion of the recess part 51f exposed to outside is set to a first exposed part E1.

In addition, a part of a surface of the second bottom wall part 51b is exposed to outside as indicated by the shaded part of FIG. 5(b) in the state in which the first separator 50 is embedded in the first molded resin part 45. Here, the portion of the second bottom wall part 51b exposed to outside is set to a second exposed part E2.

Furthermore, parts of a surface of the side wall part 51c are exposed to outside as indicated by the shaded parts of FIG. 5(a) and FIG. 5(b) in the state in which the first separator 50 is embedded in the first molded resin part 45. Here, the portions of the side wall part 51c exposed to outside are set to third exposed parts E3. Note that two third exposed parts E3 are provided to face each other in the direction intersecting the longitudinal direction of the first molded resin part 45, that is, to face each other in the transverse direction.

In addition, a surface of the partition wall 51d of the first separator 50 is exposed to outside as indicated by the shaded part of FIG. 5(a) in the state in which the first separator 50 is embedded in the first molded resin part 45. Here, the portion of the partition wall 51d exposed to outside is set to a fourth exposed part E4.

The fourth exposed part E4 (the exposed part of the partition wall 51d) is disposed on the front side of the first molded resin part 45, and the first exposed part E1 (the exposed part of the recess part 51f) and the second exposed part E2 (the exposed part of the second bottom wall part 51b) are disposed on the back side of the first molded resin part 45. That is, the fourth exposed part E4 (a part) of the first separator 50 on the front side (one side) in the direction intersecting the longitudinal direction thereof and the first and second exposed parts E1 and E2 (parts) of the first separator 50 on the back side (the other side) in the direction intersecting the longitudinal direction thereof are each exposed to outside.

Figure 9:
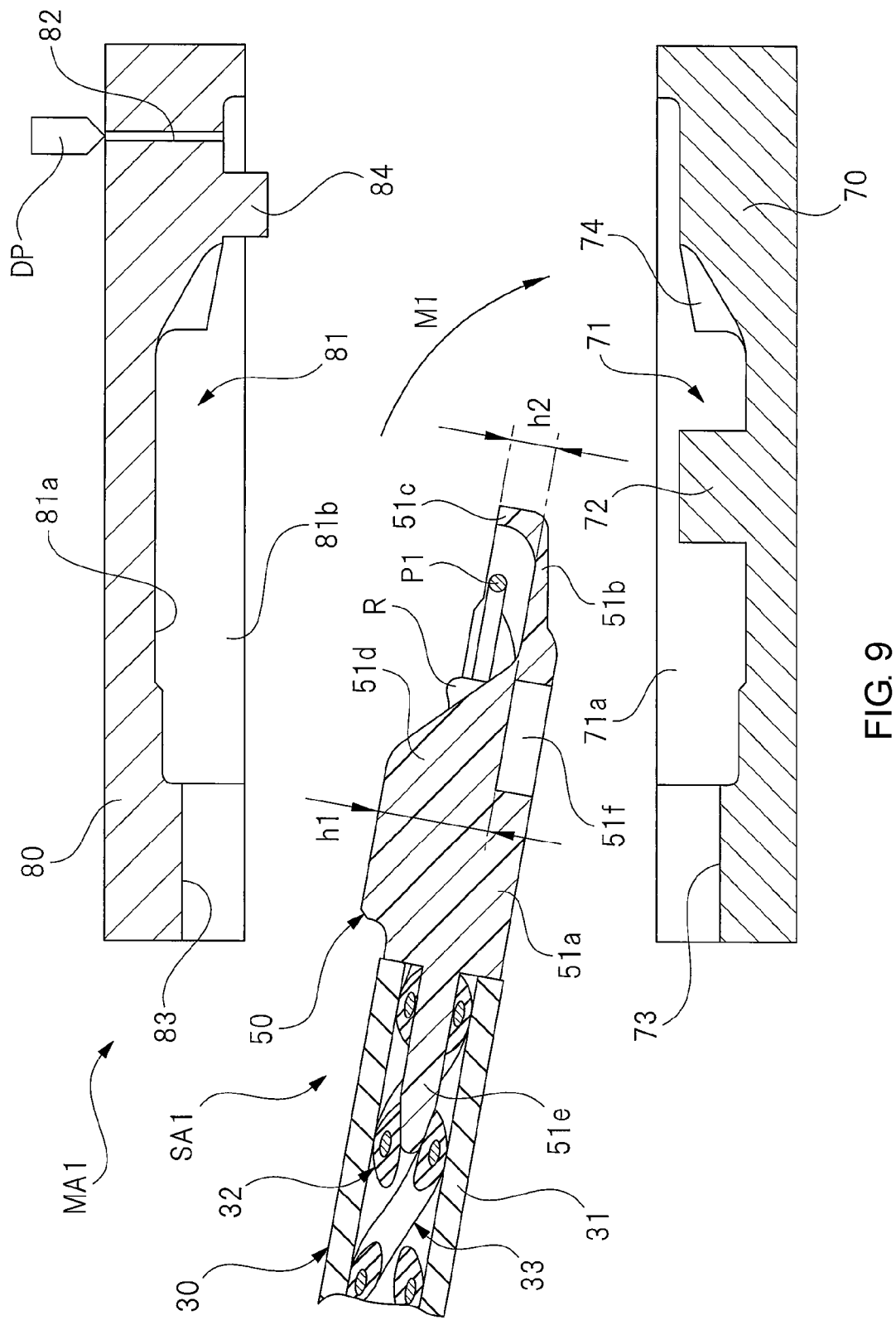
FIG. 9 is a cross-sectional view for describing a first manufacturing process of a tip part of a touch sensor unit for a PSD.

These first exposed part E1 to fourth exposed part E4 are portions each supported by the lower mold 70 and the upper mold 80 (see FIG. 9). In other words, the portions other than the first exposed part E1 to the fourth exposed part E4 of the first molded resin part 45 (the portions of FIG. 5 not shaded) are portions exposed to a cavity CA (see FIG. 11) that is formed inside the pair of molds 70 and 80.

As described above, the first separator 50 includes the portions each supported by the pair of molds 70 and 80 when the first molded resin part 45 is injection-molded. Thus, the resistor R and the pair of caulking members SW (refer to FIG. 6(a)) held in the first separator 50 are prevented from violently shaking inside the cavity CA of the pair of molds 70 and 80 by a molten resin MR (see FIG. 11) filled thereinto at a predetermined pressure.

A second molded resin part 46 as a terminal part is integrally provided between the proximal end part (the tip part in the longitudinal direction) of the sensor unit 30 and the end part of the wiring part 40 as illustrated in FIG. 4 and FIG. 7. The second molded resin part 46 covers the proximal end parts of the insulation tube 31 and the pair of electrodes 32 and 33, and one-end parts of the rubber tube 43 and the pair of wiring cords 41 and 42 to protect the terminals of the sensor unit 30 and the wiring part 40. In addition, a second separator 60 as an insulation member and two caulking members SW are embedded in the second molded resin part 46 through insert molding.

Here, the pair of caulking members SW are caulked by a caulking jig such as electrical pliers, and accordingly, the proximal end parts of the pair of electrodes 32 and 33 are electrically connected firmly to one end part of the pair of wiring cords 41 and 42. In addition, the pair of caulking members SW are disposed on both sides of a partition wall 61c of the second separator 60 and accordingly are prevented from short-circuiting mutually.

In addition, in FIG. 4, description of the second molded resin part 46 is omitted and the outline of the second molded resin part 46 is indicated by dashed lines in order to facilitate understanding of the internal structure of the second molded resin part 46.

As described above, the second molded resin part 46 prevents the proximal end parts of the insulation tube 31 and the pair of electrodes 32 and 33, the end parts of the rubber tube 43 and the pair of wiring cords 41 and 42, most parts of the second separator 60 excluding a part thereof, and the pair of caulking members SW from being exposed to outside to protect these constituent components.

However, a part of the second separator 60 is exposed to outside as indicated by the shaded part of FIG. 7, and thus an unnecessary increase in the size of the second molded resin part 46 is avoided. Here, the portion of the second separator 60 exposed to outside does not affect its function and durability even if it is exposed to outside.

In addition, the second molded resin part 46 is formed by setting the proximal end part of the insulation tube 31 into which the second separator 60, the pair of caulking members SW, and the like have been assembled and one end part of the rubber tube 43 in the lower mold and the upper mold (not illustrated) and injecting a molten rubber material or the like into the molds. That is, the second molded resin part 46 is also formed similarly to the first molded resin part 45, and the constituent components such as the second separator 60, the pair of caulking members SW, and the like are embedded in the second molded resin part 46 through the insert molding.

In addition, the second molded resin part 46 is formed using the same rubber material as the insulation tube 31 and the rubber tube 43 having sufficient flexibility. However, for example, it can be formed of a rubber material with higher hardness than the insulation tube 31 and the rubber tube 43 in order to protect the second separator 60, the pair of caulking members SW, and the like embedded in the second molded resin part 46 more reliably.

The second molded resin part 46 is formed in a substantially cylindrical shape extending in the extension direction of the sensor unit 30 and the wiring part 40 as illustrated in FIG. 7. In addition, both end parts of the second molded resin part 46 in the longitudinal direction are integrated with the proximal end part of the insulation tube 31 and the end part of the rubber tube 43 while covering a proximal end part of the insulation tube 31 and the end part of the rubber tube 43.

The second separator 60 embedded in the second molded resin part 46 is formed in a predetermined shape as illustrated in FIG. 8 by injection-molding a resin material such as a plastic. The second separator 60 has a housing body part 61 that houses the pair of caulking members SW. The housing body part 61 is formed in a substantially groove shape and both sides are open in the longitudinal direction.

Specifically, the housing body part 61 has a planar bottom wall part 61a and a pair of side wall parts 61b standing up from both sides of the bottom wall part 61a in the transverse direction. By causing both sides of the housing body part 61 to be open in the longitudinal direction as described above, the conductive lines 32b and 33b of the pair of electrodes 32 and 33 (see FIG. 4) and the electrical wires 41b and 42b of the pair of wiring cords 41 and 42 (see FIG. 4) can be led to the pair of caulking members SW provided in the housing body part 61.

In addition, the partition wall 61c extending in the longitudinal direction of the second separator 60 is provided on an inner side of the housing body part 61. The partition wall 61c divides the inner side of the housing body part 61 into two in the transverse direction and functions to prevent the pair of caulking members SW from short-circuiting. Furthermore, a height of the partition wall 61c protruding from the bottom wall part 61a is set to be higher than a height of the side wall part 61b protruding from the bottom wall part 61a.

In addition, an insertion part 61d that is inserted to the proximal end part of the insulation tube 31 (see FIG. 4) is integrally provided on the conductive lines 32b and 33b side (the right side in the drawing) in the longitudinal direction of the partition wall 61c. The insertion part 61d extends in the longitudinal direction of the second separator 60 and is formed in a substantially cylindrical shape, and a tip side thereof becomes tapered. Thus, the insertion part 61d can be easily inserted into the insulation tube 31.

More specifically, the insertion part 61d is inserted between the pair of electrodes 32 and 33 inside the insulation tube 31. Accordingly, the second separator 60 holding the pair of caulking members SW is held by the proximal end part of the insulation tube 31 without rattling.

Figure 8A:
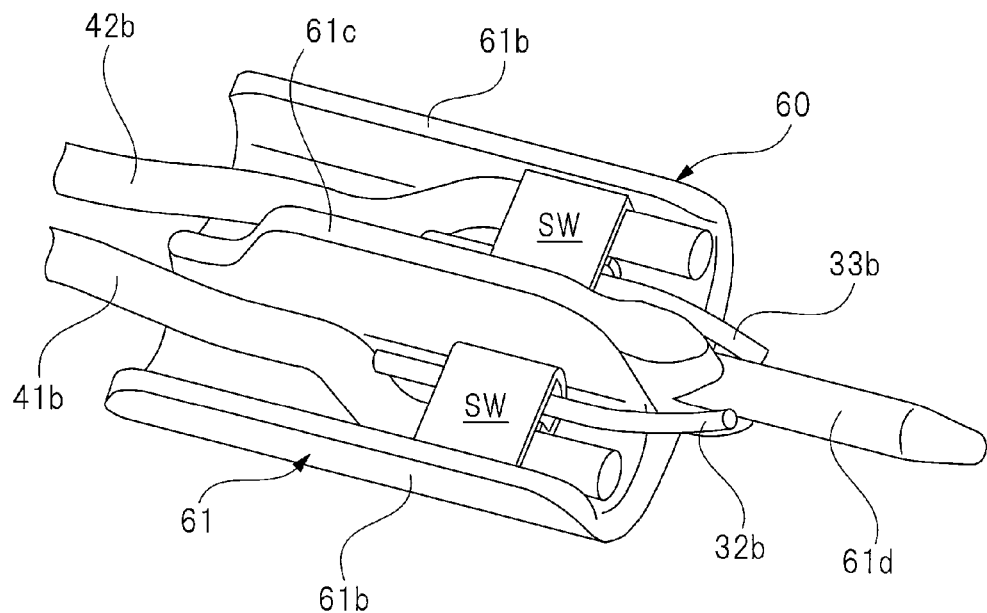
FIG. 8(*a*) and FIG. 8(*b*) are perspective views illustrating a second separator.
Figure 8B:
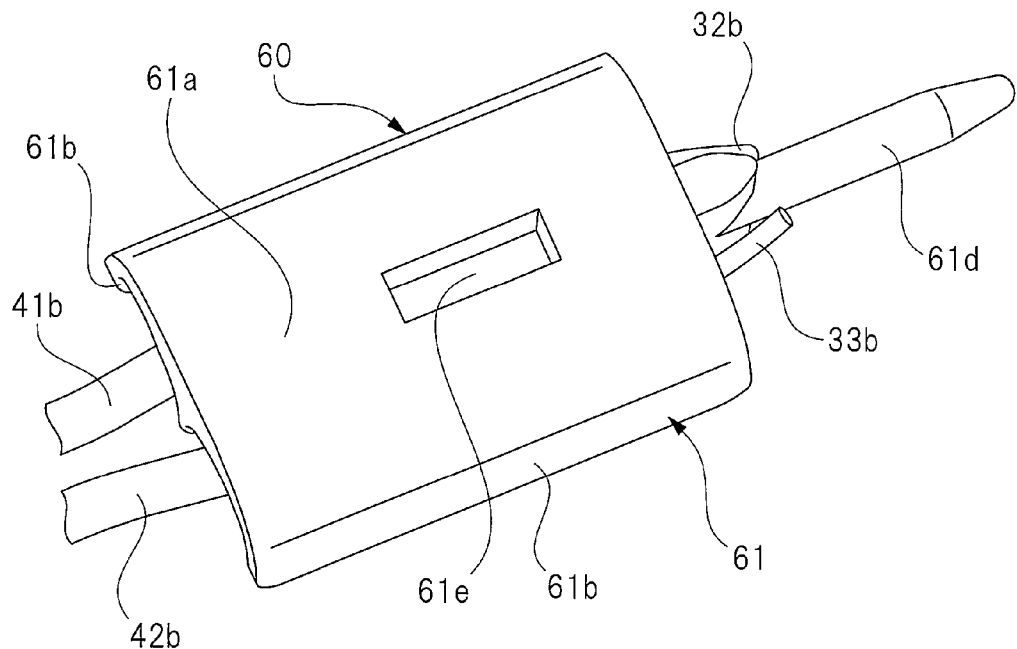

A recess part 61e receding toward an inner side of the bottom wall part 61a is provided in a portion of the bottom wall part 61a corresponding to an outer side of the housing body part 61 as illustrated in FIG. 8(b). The recess part 61e is open in a substantially rectangular shape. More specifically, the recess part 61e extends in the direction intersecting the longitudinal direction of the second separator 60, and a cross-section thereof in the longitudinal direction of the second separator 60 has a non-circular shape (substantially rectangular shape). Here, the recess part 61e constitutes an engagement part in the disclosure.

Figure 7B:
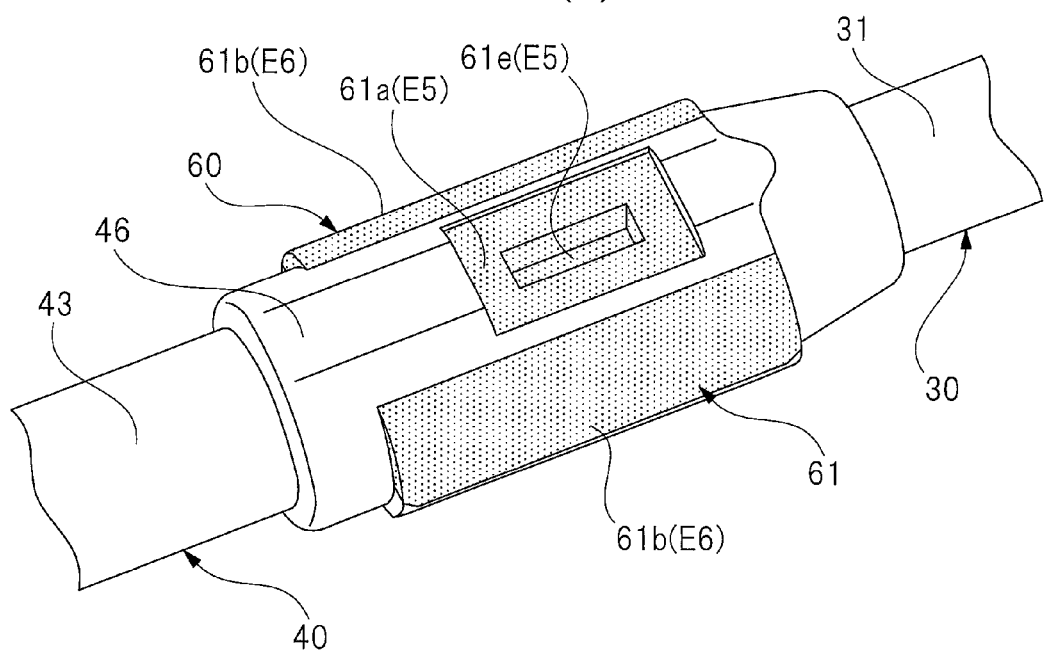

In addition, the recess part 61e of the second separator 60 and a part of the bottom wall part 61a around the recess part are exposed to outside as indicated by the shaded parts of FIG. 7(b) in the state in which the second separator 60 is embedded in the second molded resin part 46. Here, the portions of the recess part 61e and the bottom wall part 61a exposed to outside are set to a fifth exposed part E5.

In addition, surfaces of the pair of side wall parts 61b are exposed to outside as indicated by the shaded parts of FIG. 7(a) and FIG. 7(b) in the state in which the second separator 60 is embedded in the second molded resin part 46. Here, the portions of the pair of side wall parts 61b exposed to outside are set to a sixth exposed part E6.

Furthermore, a surface of the partition wall 61c of the second separator 60 is also exposed to outside as indicated by the shaded part of FIG. 7(a) in the state in which the second separator 60 is embedded in the second molded resin part 46. Here, the portion of the partition wall 61c exposed to outside is set to a seventh exposed part E7.

The seventh exposed part E7 (the exposed part of the partition wall 61c) is disposed on a front side of the second molded resin part 46, and the fifth exposed part E5 (the exposed parts of the recess part 61e and the bottom wall part 61a) is disposed on the back side of the second molded resin part 46. That is, the seventh exposed part E7 (a part) of the second separator 60 on the front side (one side) in the direction intersecting the longitudinal direction thereof and the fifth exposed part E5 (another part) of the second separator 60 on the back side (the other side) in the direction intersecting the longitudinal direction thereof are each exposed to the outside.

The fifth exposed part E5 to the seventh exposed part E7 are portions supported by the lower mold and the upper mold (not illustrated). In other words, the portion other than the fifth exposed part E5 to the seventh exposed part E7 of the second molded resin part 46 (the portion not shaded in FIG. 7(a) and FIG. 7(b)) is exposed to a cavity (not illustrated) formed inside the pair of molds.

As described above, the second separator 60 also has the portion supported by each of the lower mold and the upper mold when the second molded resin part 46 is injection-molded, similarly to the first separator 50. Thus, the pair of caulking members SW (see FIG. 8(a)) held in the second separator 60 are prevented from violently shaking in the cavity of the upper and lower molds due to a molten resin (not illustrated) filled thereinto at a predetermined pressure.

Next, a processing procedure of the terminals on both sides of the sensor unit 30 in the longitudinal direction formed as described above, i.e., a molding procedure of the first molded resin part 45 and the second molded resin part 46, will be described in detail with reference to drawings.

Note that, since both the first molded resin part 45 and the second molded resin part 46 are molded in the same procedure, the molding procedure of the first molded resin part 45 will be described as an example.

Figure 10:
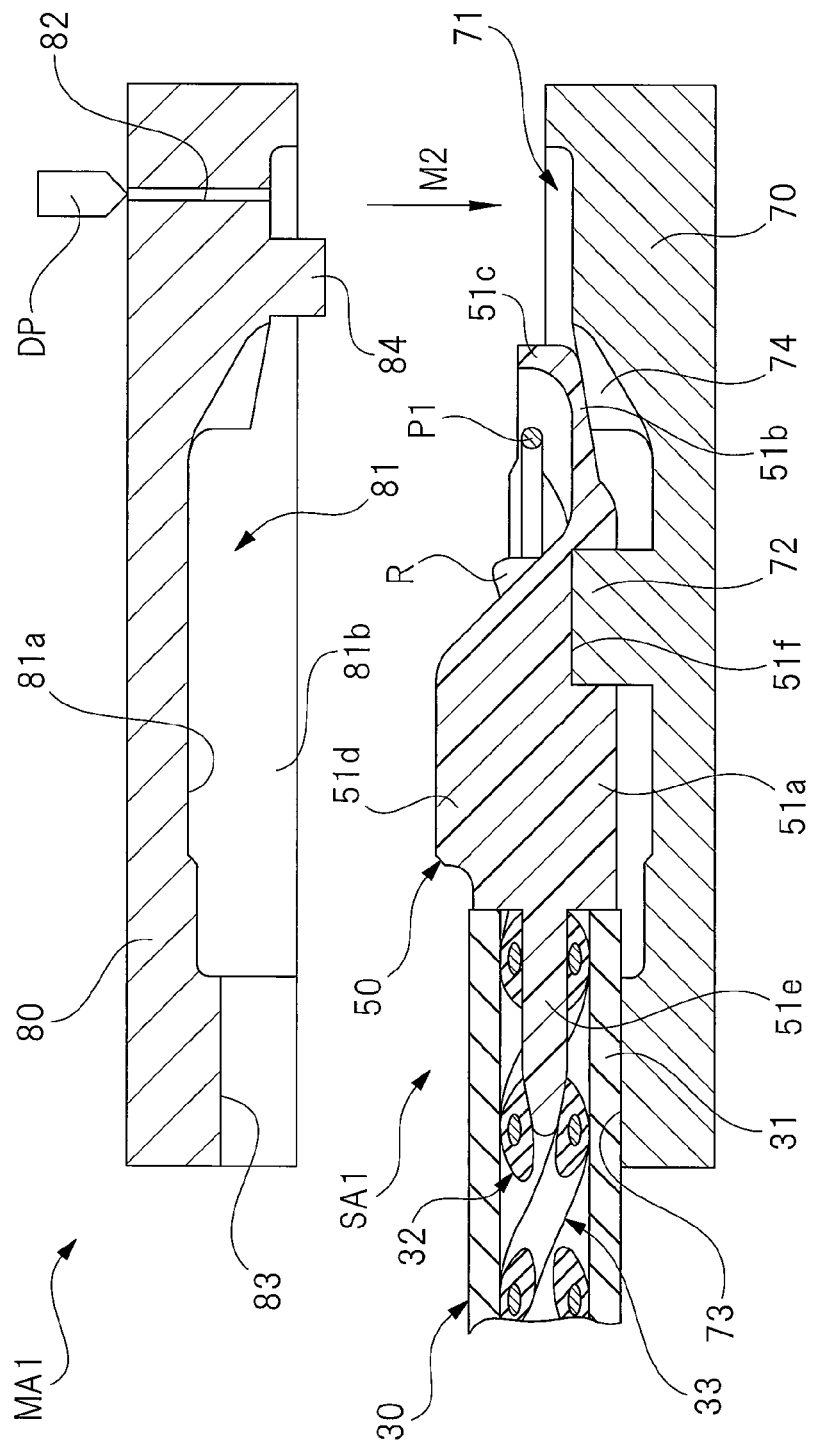
FIG. 10 is a cross-sectional view for describing a second manufacturing process of the tip part of the touch sensor unit for a PSD.
Figure 11:
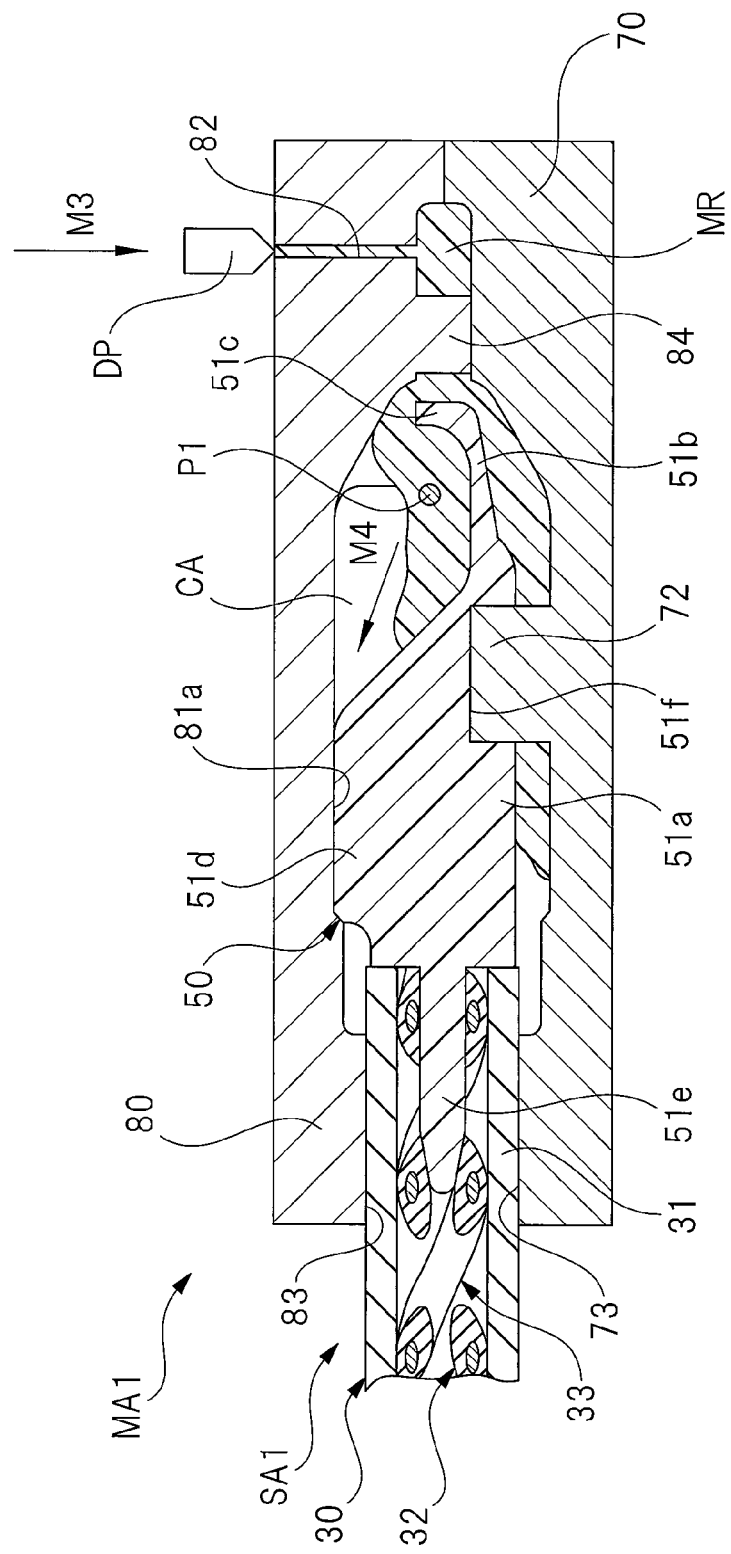
FIG. 11 is a cross-sectional view for describing a third manufacturing process of the tip part of the touch sensor unit for a PSD.

FIG. 9 is a cross-sectional view for describing a first manufacturing process of a tip part of the touch sensor unit for a PSD, FIG. 10 is a cross-sectional view for describing a second manufacturing process of the tip part of the touch sensor unit for a PSD, and FIG. 11 is a cross-sectional view for describing a third manufacturing process of the tip part of the touch sensor unit for a PSD.

The first molded resin part 45 (see FIG. 5) forming the tip part of the touch sensor unit 20 for a PSD is molded using an injection molding device MA1 as illustrated in FIG. 9. Before the molding procedure of the first molded resin part 45 is described, structures of the lower mold 70 and the upper mold 80 forming the injection molding device MA1 will be described.

The injection molding device MA1 has the lower mold (a first mold) 70 that is fixed to a base which is not illustrated. The lower mold 70 has a first concave part 71 in which a sub-assembly SA1 is housed with a predetermined gap. Here, the sub-assembly SA1 refers to an assembled state of the resistor R, the pair of caulking members SW, and the first separator 50 into the tip part of the sensor unit 30 as illustrated in FIG. 9.

An insertion protrusion (a fixed engaged part) 72 that is inserted into the recess part 51f of the first separator 50 is provided to be integrated with the first concave part 71 of the lower mold 70. The insertion protrusion 72 protrudes at a predetermined height from the bottom of the first concave part 71, and is inserted into the recess part 51f almost perfectly without rattling.

As described above, since the recess part 51f and the insertion protrusion 72 that are engaged with each other extend each in the direction intersecting the longitudinal direction of the first separator 50 and a cross-section of the first separator 50 in the longitudinal direction is a non-circular shape, the first separator 50 can be supported by the lower mold 70 with good accuracy without rattling, and thus the first separator 50 can be easily set in the lower mold 70.

In addition, a first holding concave part 73 that holds the periphery of the tip part of the sensor unit 30 with tight attachment is provided in the lower mold 70. Accordingly, it prevents the molten resin MR (see FIG. 11) filled into the cavity CA (see FIG. 11) from leaking to the outside in the state in which the lower mold 70 is butted against the upper mold 80.

Furthermore, an abutting protrusion 74 on which a tip part of the second bottom wall part 51b of the first separator 50 abuts is provided in the lower mold 70. The abutting protrusion 74 is provided near the shallowest portion (the right side in the drawing) of the first concave part 71.

In addition, a first side wall support face 71a that supports the side wall part 51c (see FIG. 5) of the first separator 50 is provided on an opening side (the upper side in the drawing) of the first concave part 71.

The injection molding device MA1 has the upper mold (a second mold) 80 that is lifted and lowered by a lifting mechanism, which is not illustrated. The upper mold 80 has a second concave part 81 in which the sub-assembly SA1 is housed with a predetermined gap. A support face 81a that supports the partition wall 51d of the first separator 50 is provided in the deepest part of the second concave part 81. Accordingly, the first separator 50 is supported by the upper mold 80 without rattling in the state in which the lower mold 70 is butted against the upper mold 80.

Furthermore, a flow passage 82 through which the molten resin MR flows is provided in the upper mold 80, and the outlet side (the lower side in the drawing) of the flow passage 82 is open to the second concave part 81. Meanwhile, a dispenser DP that supplies the molten resin MR is provided on the inlet side (the upper side in the drawing) of the flow passage 82. Accordingly, the molten resin MR is supplied from the dispenser DP to the flow passage 82 (the cavity CA) at a predetermined pressure.

In addition, a second holding concave part 83 that holds the periphery of the tip part of the sensor unit 30 with tight attachment is provided in the upper mold 80. Accordingly, the molten resin MR filled into the cavity CA is prevented from leaking to the outside in the state in which the lower mold 70 is butted against the upper mold 80.

Furthermore, a second side wall support face 81b that supports the side wall part 51c of the first separator 50 is provided on an opening side (the lower side in the drawing) of the second concave part 81. Note that a protrusion part 84 provided near the outlet side of the flow passage 82 of the upper mold 80 is to form the through hole 45a (see FIG. 5) of the first molded resin part 45.

[First Manufacturing Process]

First, the sub-assembly SA1 that has been assembled in a separate manufacturing process is prepared as illustrated in FIG. 9. Next, the first separator 50 side of the sub-assembly SA1 is set to face the lower mold 70. Then, the sub-assembly SA1 is moved and the insertion protrusion 72 is inserted into the recess part 51f as indicated by the solid arrow M1. Then, the insertion protrusion 72 is completely inserted into the recess part 51f, then the second bottom wall part 51b is supported by the abutting protrusion 74, and the periphery of the tip part of the sensor unit 30 is tightly attached to the first holding concave part 73.

Accordingly, the recess part 51f is engaged with the insertion protrusion 72, and thus the setting of sub-assembly SA1 in the lower mold 70 is completed. That is, a part on one side of the first separator 50 in the direction intersecting the longitudinal direction (the recess part 51f and the second bottom wall part 51b) is supported by the lower mold 70, and thereby the first manufacturing process (first process) is completed.

[Second Manufacturing Process]

Next, the lifting mechanism (not illustrated) of the injection molding device MA1 is driven to bring the upper mold 80 in contact with the lower mold 70 as indicated by the solid arrow M2 of FIG. 10.

Accordingly, the partition wall 51*d* of the first separator 50 abuts the support face 81*a* of the upper mold 80 such that the partition wall is supported thereby, and the periphery of the tip part of the sensor unit 30 is tightly attached to the second holding concave part 83 as illustrated in FIG. 11. In addition, the protrusion part 84 of the upper mold 80 abuts the shallowest part (the right side in the drawing) of the first concave part 71 of the lower mold 70. That is, a part on the other side of the first separator 50 in the direction intersecting the longitudinal direction (the partition wall 51*d*) is supported by the upper mold 80, and thereby the second manufacturing process (second process) is completed.

Therefore, the cavity CA for forming the first molded resin part 45 (see FIG. 5) is formed between the first concave part 71 of the lower mold 70 and the second concave part 81 of the upper mold 80. Thus, the portions of the lower mold 70 and the upper mold 80 in contact with the first separator 50, that is, the portions including the insertion protrusion 72, the abutting protrusion 74, the support face 81*a*, the first side wall support face 71*a*, and the second side wall support face 81*b*, are exposed to the outside of the first molded resin part 45.

[Third Manufacturing Process]

Next, the dispenser DP is driven to transfer the molten resin MR to the flow passage 82 at a predetermined pressure as indicated by the solid arrow M3 of FIG. 11. Then, the molten resin MR flows into the cavity CA formed within the pair of molds 70 and 80, and then the cavity CA is filled with the molten resin MR as indicated by the solid arrow M4. At this time, the molten resin MR is transferred to the cavity CA, and thus the molten resin MR spreads to corners of the cavity CA.

Here, the pressure of the molten resin MR is applied to the first separator 50 and the resistor R, and even to the pair of caulking members SW. However, since the first separator 50 is supported by both the lower mold 70 and the upper mold 80 in the upper-lower direction and the depth direction of the drawing, the first separator 50 does not move or shake within the cavity CA. Thus, movement or shake of the resistor R and the pair of caulking members SW held in the first separator 50 is also prevented.

Therefore, application of an excessive force to the insertion components such as the first separator 50 is effectively suppressed, and further accuracy in molding the first molded resin part 45 (see FIG. 5) that differs for each component is suppressed. Accordingly, the first molded resin part 45 is molded, and thereby the third manufacturing process (third process) is completed.

Then, the hardened first molded resin part 45 is released from the pair of molds 70 and 80. Accordingly, the touch sensor unit 20 for a PSD with the first exposed part E1 to the fourth exposed part E4 is completed as illustrated in FIG. 5.

As is described in detail above, according to Embodiment 1, the first separator 50 for preventing the pair of electrodes 32 and 33 from short-circuiting each other is provided on the end part of the pair of electrodes 32 and 33 in the longitudinal direction, the first molded resin part 45 covering the first separator 50 is provided on the end part of the insulation tube 31 in the longitudinal direction, and the part (the fourth exposed part E4) on one side of the first separator 50 in the direction intersecting the longitudinal direction and the part (the first exposed part E1 and the second exposed part E2) on the other side of the first separator 50 in the direction intersecting the longitudinal direction are each exposed to the outside.

Accordingly, when the first separator 50 is embedded in the first molded resin part 45 through insert-molding (injection molding), the first separator 50 can be supported by the lower mold 70 and the upper mold 80, and the portions of the first separator 50 supported by the pair of molds 70 and 80 at this time are the portions to be exposed to the outside (the first exposed part E1 to the fourth exposed part E4).

Therefore, the molten resin MR for forming the first molded resin part 45 can be injected into the pair of molds 70 and 80 at a predetermined pressure without a concern for misalignment of the first separator 50 with the first molded resin part 45. Thus, the manufacturing processes can be simplified, molding accuracy of the first molded resin part 45 can be improved, and further variation in each of products can be reduced and a yield can be enhanced.

In addition, according to Embodiment 1, the recess part 51*f* extending in the direction intersecting the longitudinal direction of the first separator 50 and having the cross-section in a non-circular shape in the longitudinal direction of the first separator 50 is provided in the first separator 50, and the recess part 51*f* is engaged with the insertion protrusion 72 provided in the lower mold 70 in the first manufacturing process.

Accordingly, the first separator 50 can be supported by the lower mold 70 with high accuracy without rattling, and thus the first separator 50 can be easily set in the lower mold. This also can simplify the manufacturing process.

Note that the same effects of the above-described Embodiment 1 can be exhibited on the second separator 60 and the second molded resin part 46 side. That is, the insertion protrusion (fixed-type engaged part) of the lower mold, which is not illustrated, is inserted into the recess part 61*e* (see FIG. 8) of the second separator 60. In addition, the fifth exposed part E5 (the exposed parts of the recess part 61*e* and the bottom wall part 61*a*) is supported by the lower mold, and the seventh exposed part E7 (the exposed part of the partition wall 61*c*) is supported by the upper mold (not illustrated) as illustrated in FIG. 7.

Next, Embodiment 2 of the disclosure will be described in detail using drawings. Note that the same reference symbols will be given to parts having the same functions as those of the above-described Embodiment 1, and detailed description thereof will be omitted.

Figure 12:
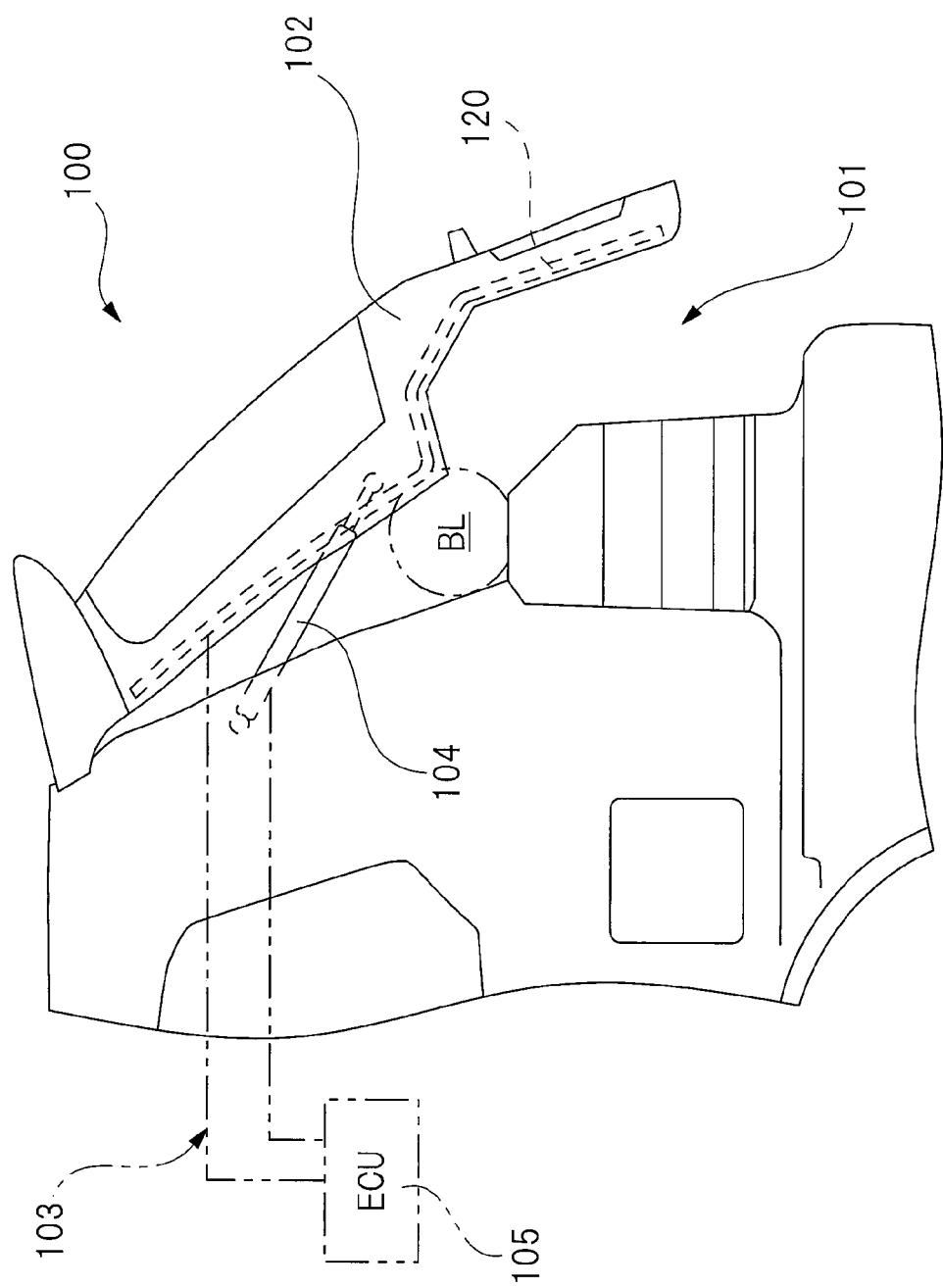
FIG. 12 is a side view illustrating a power tailgate (PTG) of a vehicle.
Figure 13:
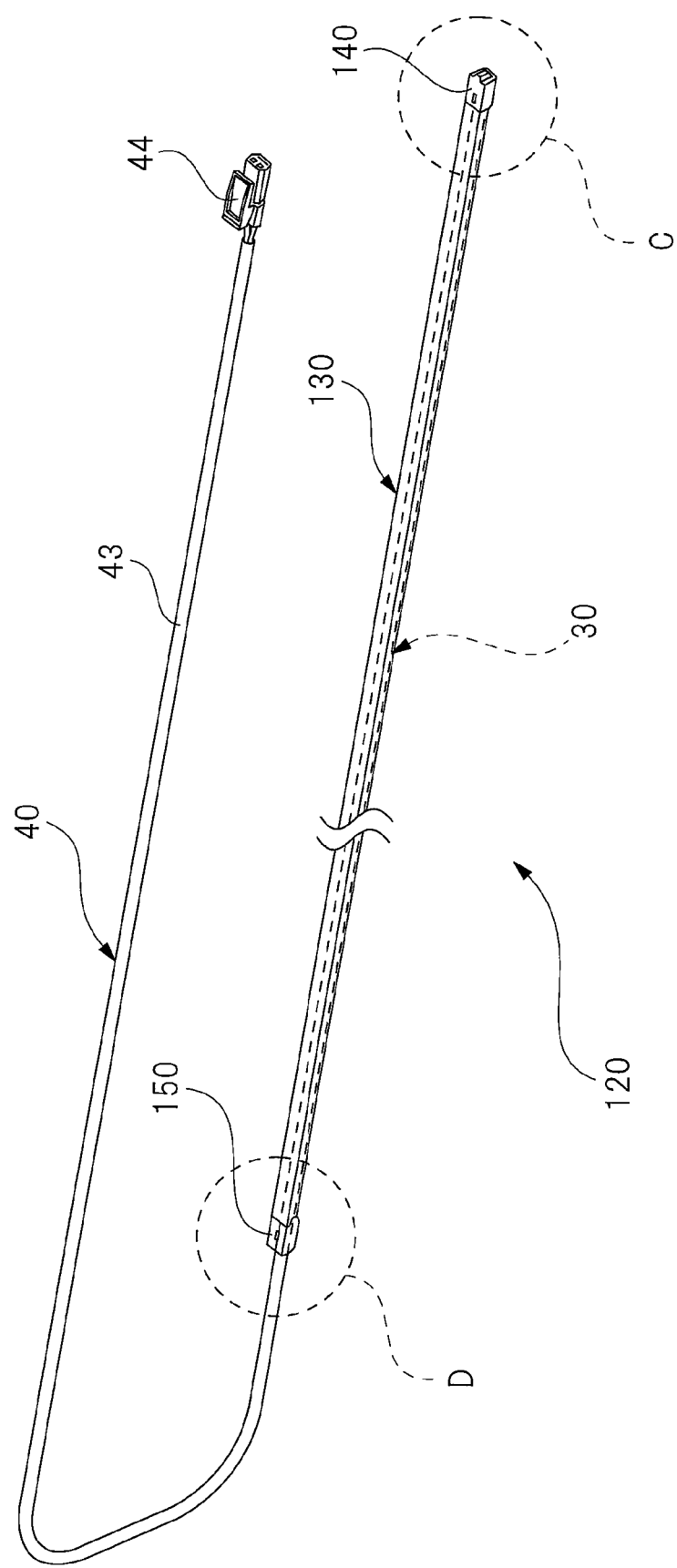
FIG. 13 is a perspective view illustrating the touch sensor unit for the PTG of FIG. 12.
Figure 14:
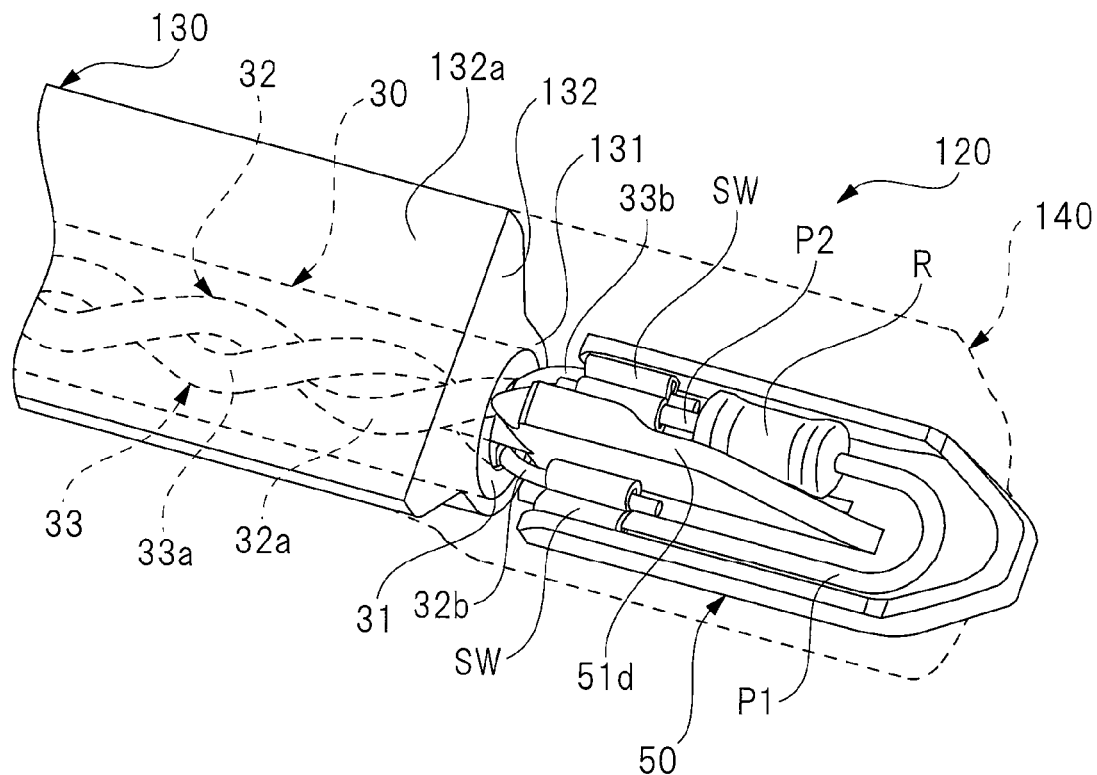
FIG. 14 is a perspective view in which the portion of the dashed circle C of FIG. 13 is enlarged.
Figure 15:
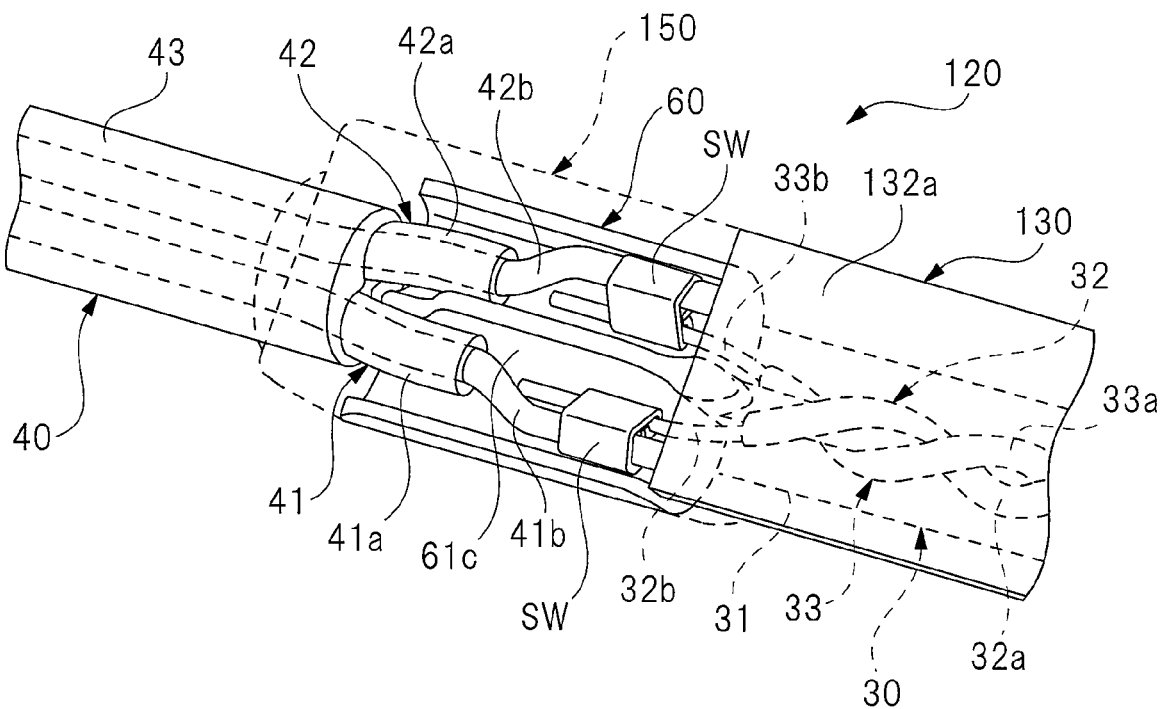
FIG. 15 is a perspective view in which the portion of the dashed circle D of FIG. 13 is enlarged.
Figure 16A:
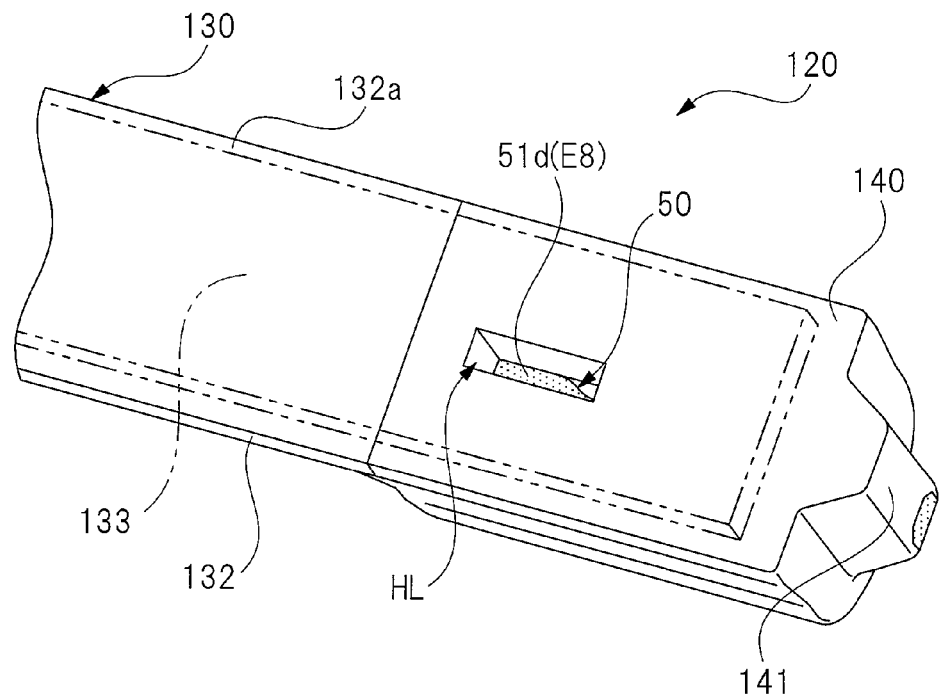
FIG. 16(*a*) and FIG. 16(*b*) are perspective views illustrating appearances of the first terminal part of FIG. 14.
Figure 16B:
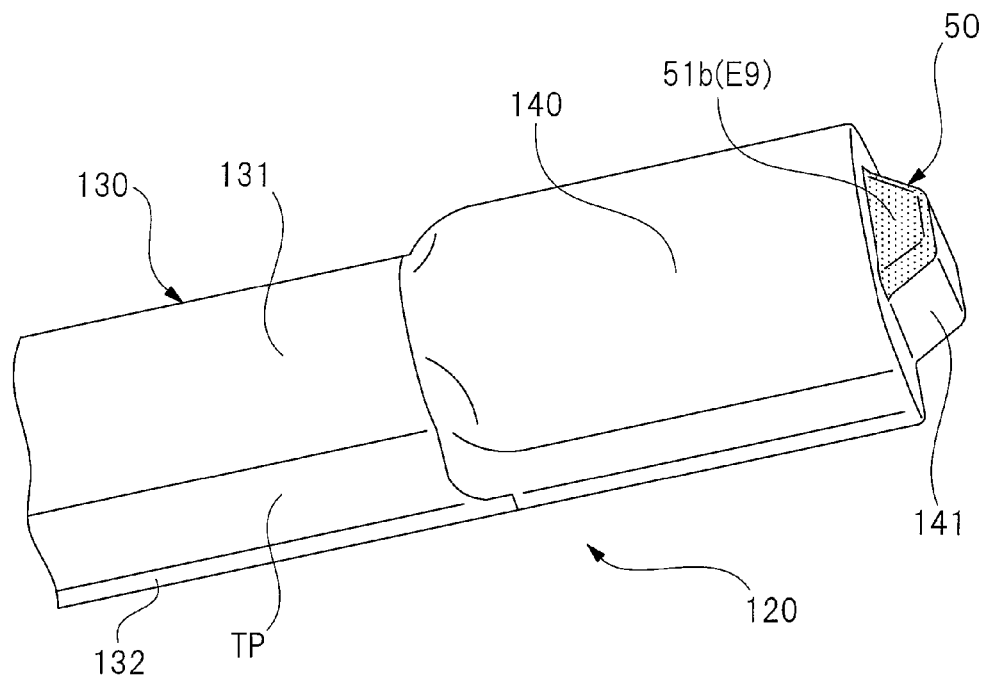
Figure 17A:
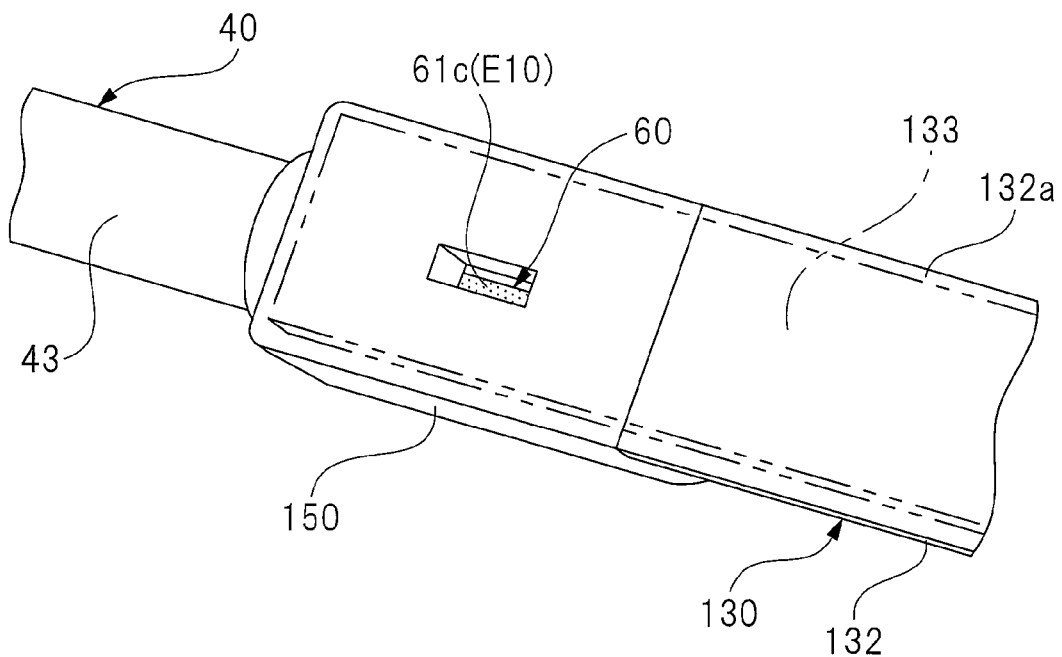
FIG. 17(*a*) and FIG. 17(*b*) are perspective views illustrating appearances of the second terminal part of FIG. 15.
Figure 17B:
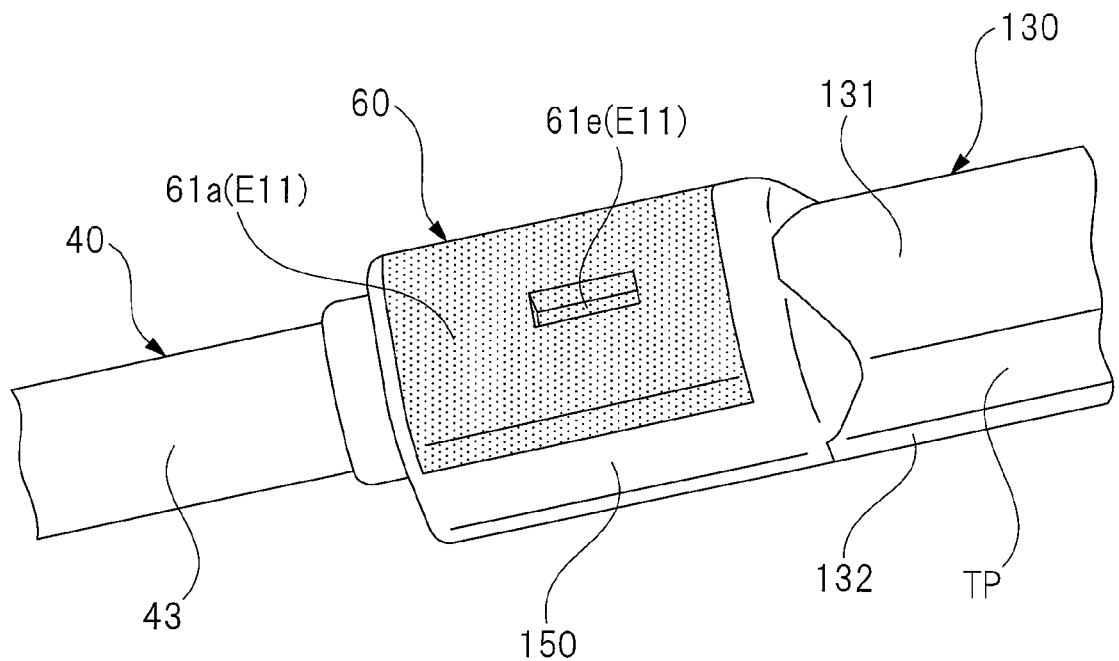

FIG. 12 is a side view illustrating a power tailgate (PTG) of a vehicle, FIG. 13 is a perspective view illustrating a touch sensor unit for the PTG of FIG. 12, FIG. 14 is a perspective view in which the portion of the dashed circle C of FIG. 13 is enlarged, FIG. 15 is a perspective view in which the portion of the dashed circle D of FIG. 13 is enlarged, FIG. 16(*a*) and FIG. 16(*b*) are perspective views illustrating appearances of a first terminal part of FIG. 14, and FIG. 17(*a*) and FIG. 17(*b*) are perspective views illustrating appearances of a second terminal part of FIG. 15.

A vehicle 100 illustrated in FIG. 12 is a so-called hatch-back type vehicle, and an opening part 101 through which large-size luggage can be taken in and out of the interior of the vehicle is formed on a rear side of the vehicle 100. The opening part 101 is opened or closed by a tailgate 102 that pivots around a hinge (not illustrated) provided on a rear side of a ceiling part of the vehicle 100.

In addition, a power tailgate (PTG) device 103 is mounted in the vehicle 100. The power tailgate device 103 includes an actuator with a reducer 104 for opening and closing the tailgate 102, a controller (ECU) 105 for controlling the actuator 104 on the basis of an operation signal of an operation switch (not illustrated), and a pair of touch sensor units 120 (only one of which is illustrated in the drawing) for a PTG for detecting a contact of an obstacle BL. Note that PTG is an abbreviation for Power TailGate.

The touch sensor units 120 for a PTG are each provided on both sides of the tailgate 102, which is a fixation object, in the vehicle width direction. More specifically, the pair of the touch sensor units 120 for a PTG are disposed on both sides of the tailgate 102 in the vehicle width direction along the curved shape of the door frame. That is, the pair of the touch sensor units 120 for a PTG are curved in the curved shape of the door frame and are fixed to the tailgate 102 in the curved state.

Accordingly, when the obstacle BL is brought in contact with the touch sensor units 120 for a PTG between the opening part 101 and the tailgate 102, sensor units 30 (see FIG. 14) forming the touch sensor units 120 for a PTG are immediately elastically deformed.

In addition, the pair of the touch sensor units 120 for a PTG are each electrically connected to the controller 105, and a detection signal generated when the sensor units 30 are elastically deformed is input to the controller 105. The controller 105 drives the tailgate 102 which has been driven to be closed to be opened or stops the tailgate 102 which has been driven to be closed immediately on the basis of an input of the detection signal from the touch sensor units 120 for a PTG, regardless of an operation of the operation switch. Accordingly, insertion of the obstacle BL can be prevented in advance.

In the touch sensor unit 120 for a PTG, the sensor unit 30 is held by a sensor holder 130 as illustrated in FIG. 13 to FIG. 20. This is a difference from the touch sensor unit 20 for a PSD (see FIG. 2) of Embodiment 1. Thus, the portion of the touch sensor unit 120 for a PTG in which the sensor unit 30 is provided is thicker than that of the touch sensor unit 20 for a PSD.

In addition, a first molded resin part 140 and a second molded resin part 150 which are provided on end parts of the sensor unit 30 and the sensor holder 130 in the longitudinal direction respectively have different shapes from those of Embodiment 1 due to the sensor holder 130.

The sensor holder 130 is formed in a long shape by performing extrusion molding or the like on an insulating rubber material having flexibility, and has a hollow sensor holding barrel 131 in which the sensor unit 30 is housed and a foundation part 132 that is fixed to a sensor bracket (not illustrated) that is fixed to the door frame of tailgate 102. In addition, a thickness of the sensor holding barrel 131 is set to be thinner than that of the insulation tube 31. That is, the sensor holding barrel 131 can be elastically deformed easily by application of an external force.

Thus, a pair of electrodes 32 and 33 held in the insulation tube 31 are brought in contact with each other easily due to elastic deformation of the sensor holding barrel 131 and the insulation tube 31, and thus sufficient detection performance of the sensor unit 30 is secured.

The foundation part 132 is provided to be integrated with the sensor holding barrel 131 in the longitudinal direction. The foundation part 132 has a function of fixing the sensor holding barrel 131 to the sensor bracket, and the sensor holding barrel 131 and the insulation tube 31 are attached to the sensor bracket via the foundation part 132.

In addition, a cross-sectional shape of the foundation part 132 in the transverse direction of the sensor holder 130 is formed to be a substantially trapezoidal shape, and a double-sided tape 133 (see FIG. 16 and FIG. 17) for fixing the sensor holder 130 to the sensor bracket is affixed to a bottom face 132a of the foundation part 132.

Furthermore, the sensor holding barrel 131 and the foundation part 132 are smoothly linked to each other by a pair of inclined faces TP. By providing the inclined faces TP between the sensor holding barrel 131 and the foundation part 132 in this way, it is possible to prevent stress from concentrating between the sensor holding barrel and the foundation part 132 and causing cracks and the like. Accordingly, durability of the sensor holder 130 is improved.

As described above, the cross-sectional shape of the sensor holder 130 in the direction intersecting the longitudinal direction (the transverse direction) is set to a non-circular shape. Accordingly, while the sensor holding barrel 131 and the insulation tube 31 are elastically deformed easily, rigidity of the foundation part 132 is enhanced sufficiently and fixing intensity of the double-sided tape 133 to the sensor bracket is improved.

The first molded resin part 140 as a terminal part is integrally provided on the tip part of the sensor unit 30 (a tip part in the longitudinal direction) as illustrated in FIG. 14 and FIG. 16. The first molded resin part 140 covers tip parts of the insulation tube 31, the sensor holder 130, and the pair of electrodes 32 and 33 to protect the terminal of the sensor unit 30. In addition, a first separator 50, a resistor R, and two caulking members SW are embedded in the first molded resin part 140 using insert molding. That is, the first molded resin part 140 covers the first separator 50.

Here, in FIG. 14, description of the first molded resin part 140 is omitted and the outline of the first molded resin part 140 is indicated by dashed lines in order to facilitate understanding of the internal structure of the first molded resin part 140.

As described above, the first molded resin part 140 prevents the tip parts of the insulation tube 31, the sensor holder 130, and the pair of electrodes 32 and 33, the most parts of the first separator 50 excluding a part thereof, the resistor R, and the pair of caulking members SW from being exposed to outside to protect these constituent components.

However, as indicated by the shaded part of FIG. 16, a part of the first separator 50 is exposed to outside, and thus an unnecessary increase in the size of the first molded resin part 140 is avoided. Here, the portion of the first separator 50 exposed to outside does not affect its function and durability even if it is exposed to outside.

Here, the first molded resin part 140 is formed by setting the tip part of the insulation tube 31 into which the first separator 50, the resistor R, and the like have been assembled and the tip part of the sensor holder 130 in a lower mold 160 and an upper mold 170 (see FIG. 18) and injecting a molten rubber material or the like into these molds 160 and 170. That is, the constituent components such as the first separator 50, the resistor R, and the like are embedded in the first molded resin part 140 through the insert molding.

In addition, the first molded resin part 140 is formed of the same rubber material as the insulation tube 31 having sufficient flexibility. However, for example, it can be formed of a rubber material with higher hardness than the insulation tube 31 in order to protect the first separator 50, the resistor R, and the like embedded in the first molded resin part 140 more reliably.

A cross-sectional shape of the first molded resin part 140 in the direction intersecting the longitudinal direction is formed to be a substantially semi-elliptical shape as illustrated in FIG. 16. In addition, a proximal end part of the first molded resin part 140 in the longitudinal direction is integrated with the tip part of the sensor holder 130 while covering a part of the tip part of the sensor holder 130.

Meanwhile, an engagement protrusion 141 protruding in the longitudinal direction of the first molded resin part 140 is integrally provided on the tip part of the first molded resin part 140 in the longitudinal direction. The engagement protrusion 141 is designed to be engaged with a fixing part (not illustrated) provided in the sensor bracket. Accordingly, the tip part of the sensor holder 130 can be fixed to the tailgate 102 without rattling.

In addition, a part of a surface of the partition wall 51*d* of the first separator 50 is exposed to outside in the state in which the first separator 50 is embedded in the first molded resin part 140 as indicated by the shaded part of FIG. 16(*a*). Here, the part of the partition wall 51*d* exposed to outside is set to an eighth exposed part E8.

In addition, a part of a surface of the second bottom wall part 51*b* of the first separator 50 is exposed to outside in the state in which the first separator 50 is embedded in the first molded resin part 140 as indicated by the shaded part of FIG. 16(*b*). Here, the part of the second bottom wall part 51*b* exposed to outside is set to a ninth exposed part E9.

The eighth exposed part E8 (the exposed part of the partition wall 51*d*) is disposed on the back side of the first molded resin part 140, and the ninth exposed part E9 (the exposed part of the second bottom wall part 51*b*) is disposed on the front side of the first molded resin part 140. That is, the eighth exposed part E8 (a part) of the first separator 50 on the back side (one side) in the direction intersecting the longitudinal direction thereof and the ninth exposed part E9 (another part) of the first separator 50 on the front side (the other side) in the direction intersecting the longitudinal direction thereof are each exposed to outside.

Figure 18:
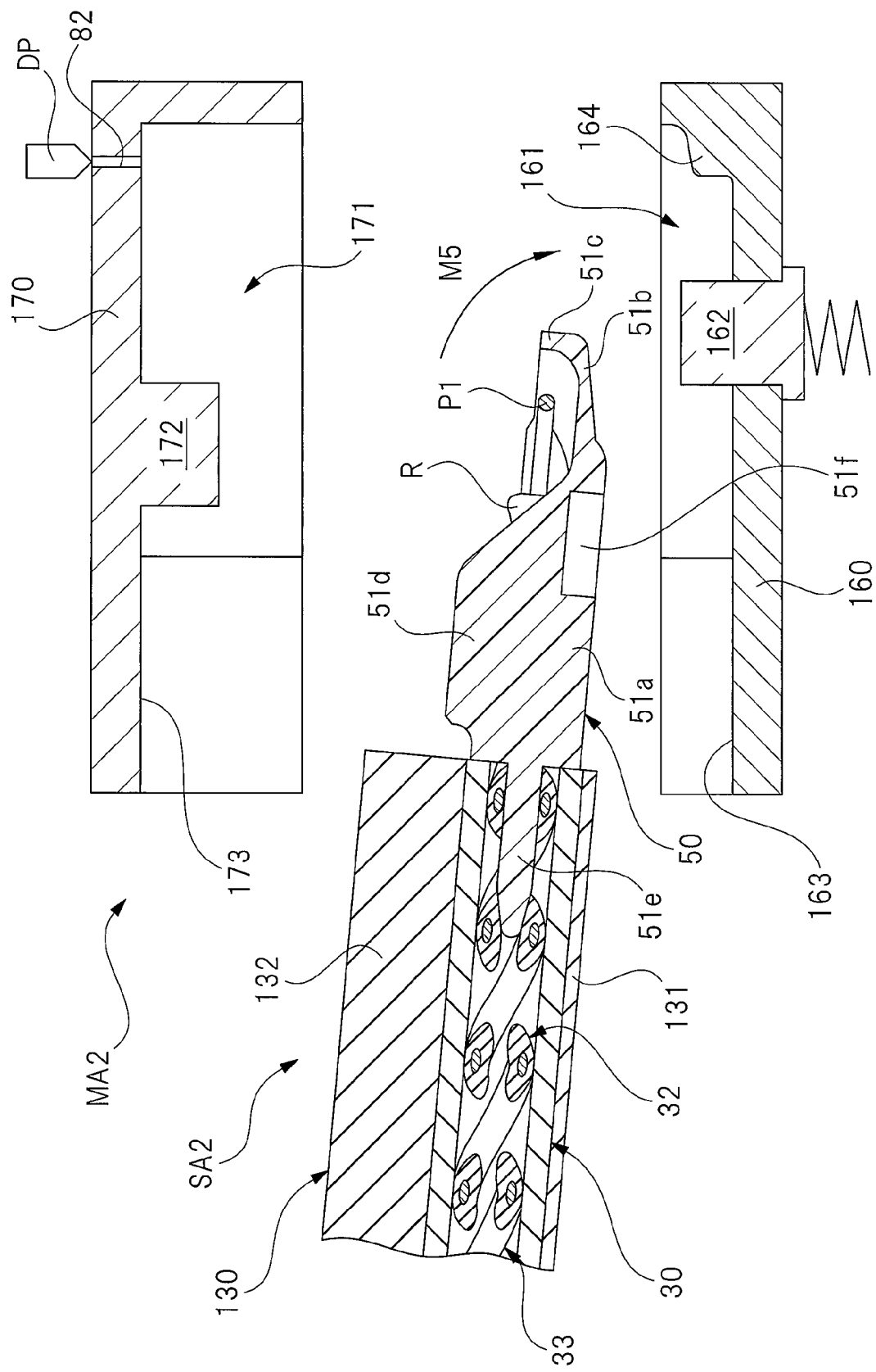
FIG. 18 is a cross-sectional view for describing a first manufacturing process of a tip part of the touch sensor unit for a PTG.

These eighth exposed part E8 and ninth exposed part E9 are each supported by the lower mold 160 and the upper mold 170 (see FIG. 18). In other words, the portions other than the eighth exposed part E8 and the ninth exposed part E9 the first molded resin part 140 (the portions not shaded in FIG. 16) are exposed to a cavity CA (see FIG. 20) formed in the pair of molds 160 and 170.

The second molded resin part 150 as a terminal part is integrally provided between the proximal end part of the sensor holder 130 (the sensor unit 30) (an end part in the longitudinal direction) and an end part of the wiring part 40 as illustrated in FIG. 15 and FIG. 17. The second molded resin part 150 covers the proximal end parts of the insulation tube 31, the sensor holder 130, and the pair of electrodes 32 and 33, and the end parts of the rubber tube 43 and the pair of wiring cords 41 and 42 to protects the terminals of the sensor unit 30 and the wiring part 40. In addition, the second separator 60 and the two caulking members SW are embedded in the second molded resin part 150 through insert molding.

In addition, in FIG. 15, description of the second molded resin part 150 is omitted and the outline of the second molded resin part 150 is indicated by dashed lines in order to facilitate understanding of the internal structure of the second molded resin part 150.

As described above, the second molded resin part 150 prevents the proximal end parts of the insulation tube 31, the sensor holder 130, and the pair of electrodes 32 and 33, the end parts of the rubber tube 43 and the pair of wiring cords 41 and 42, most parts excluding a portion of the second separator 60, and the pair of caulking members SW from being exposed to outside to protect these constituent components.

However, as indicated by the shaded part of FIG. 17, the portion of the second separator 60 is exposed to outside, and accordingly an unnecessary increase in the size of the second molded resin part 150 is avoided. Here, the portion of the second separator 60 exposed to outside does not affect its function and durability even it is exposed to outside.

In addition, the second molded resin part 150 is formed by setting the proximal end parts of the insulation tube 31 and the sensor holder 130 into which the second separator 60, the pair of caulking members SW, and the like have been assembled and the end part of the rubber tube 43 in the upper and lower molds (not illustrated) and injecting a molten rubber material or the like into the molds. That is, the second molded resin part 150 is also formed similarly to the first molded resin part 140, and the constituent components including the second separator 60, the pair of caulking members SW, and the like are embedded in the second molded resin part 150 through the insert molding.

In addition, the second molded resin part 150 is formed of the same rubber material as the insulation tube 31 and the rubber tube 43 having sufficient flexibility. However, for example, it can be formed of a rubber material with higher hardness than the insulation tube 31 and the rubber tube 43 to protect the second separator 60, the pair of caulking members SW, and the like embedded in the second molded resin part 150 more reliably.

A cross-sectional shape of the second molded resin part 150 in the direction intersecting the longitudinal direction of the sensor holder 130 and the wiring part 40 is formed to be a substantially semi-elliptical shape as illustrated in FIG. 17. In addition, both end parts of the second molded resin part 150 in the longitudinal direction is integrated with the proximal end part of the sensor holder 130 and the tip part of the rubber tube 43 while covering parts of the proximal end part of the sensor holder 130 and the tip part of the rubber tube 43.

In addition, the part of the surface of the partition wall 61*c* of the second separator 60 is exposed to outside in the state in which the second separator 60 is embedded in the second molded resin part 150 as indicated by the shaded part of FIG. 17(*a*). Here, the portion of the partition wall 61*c* exposed to outside is a tenth exposed part E10.

In addition, the surface of the bottom wall part 61*a* of the second separator 60 and the recess part 61*e* are exposed to outside in the state in which the second separator 60 is embedded in the second molded resin part 150 as indicated by the shaded part of FIG. 17(*b*). Here, the portions of the bottom wall part 61*a* and the recess part 61*e* exposed to outside is an eleventh exposed part E11.

The tenth exposed part E10 (the exposed part of the partition wall 61*c*) is disposed on the back side of the second molded resin part 150, and the eleventh exposed part E11 (the exposed parts of the bottom wall part 61*a* and the recess part 61*e*) is disposed on the front side of the second molded resin part 150. That is, the tenth exposed part E10 (a part) of the second separator 60 on the back side (one side) in the direction intersecting the longitudinal direction thereof and the eleventh exposed part E11 (another part) of the second separator 60 on the front side (the other side) in the direction intersecting the longitudinal direction thereof are each exposed to outside.

The tenth exposed part E10 and the eleventh exposed part E11 are supported by the lower mold and the upper mold (not illustrated). In other words, the portions other than the tenth exposed part E10 and the eleventh exposed part E11 of the second molded resin part 150 (the portions not shaded in FIG. 17) are exposed to the cavity (not illustrated) formed in the pair of molds.

Note that, more specifically, the second molded resin part 150 is formed through insert molding (injection molding) in the same procedure as the second molded resin part 46 (see FIG. 7) of Embodiment 1. That is, the first molded resin part 45 of Embodiment 1, the second molded resin part 46 of Embodiment 1, and the second molded resin part 150 of Embodiment 2 are each formed through the above-described first manufacturing process, second manufacturing process, and third manufacturing process.

Here, the first molded resin part 140 of Embodiment 2 is formed in a procedure a part of which is different from the above-described manufacturing processes. A molding procedure of the first molded resin part 140 will be described in detail with reference to drawings.

Figure 19:
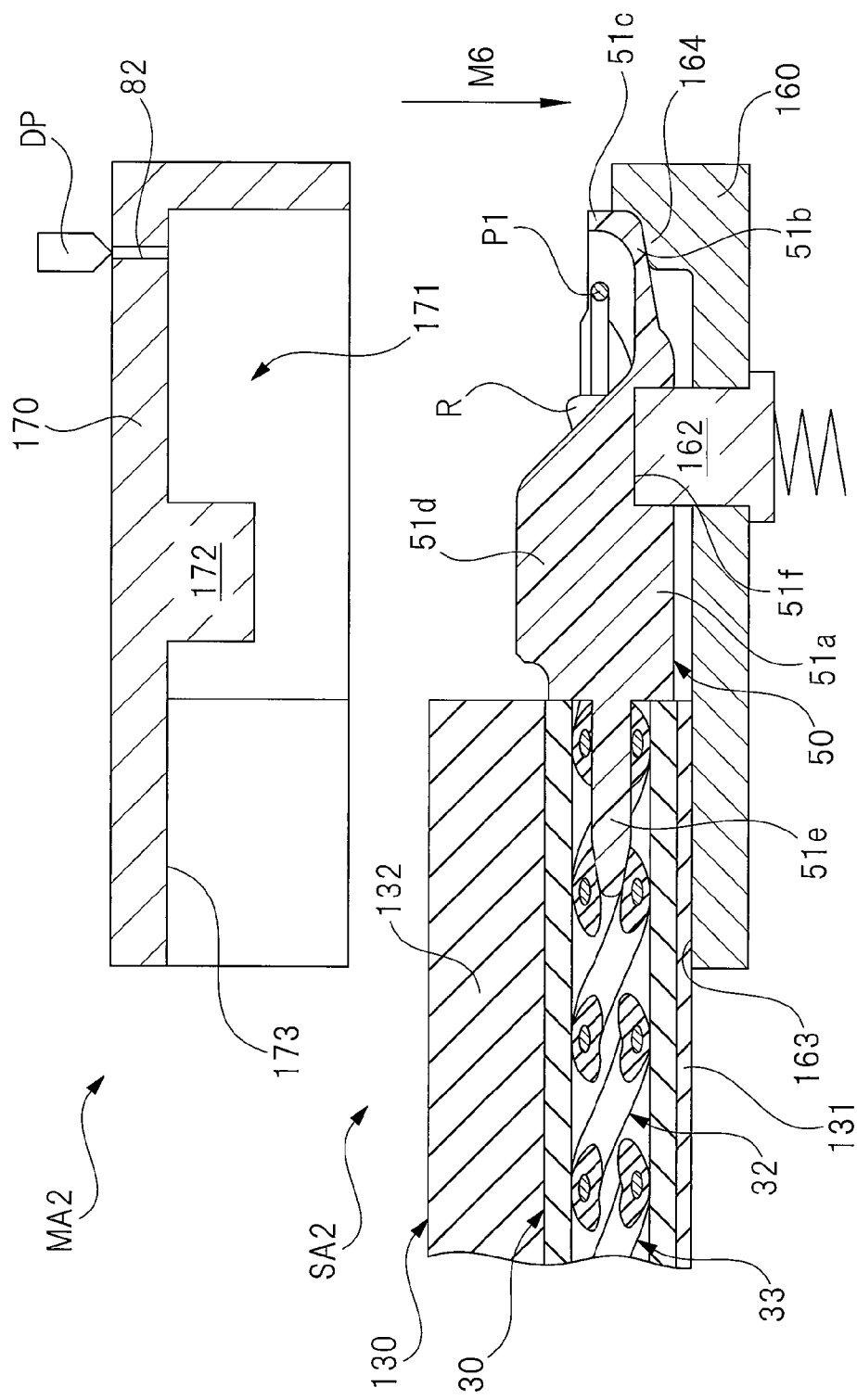
FIG. 19 is a cross-sectional view for describing a second manufacturing process of the tip part of the touch sensor unit for a PTG.
Figure 20:
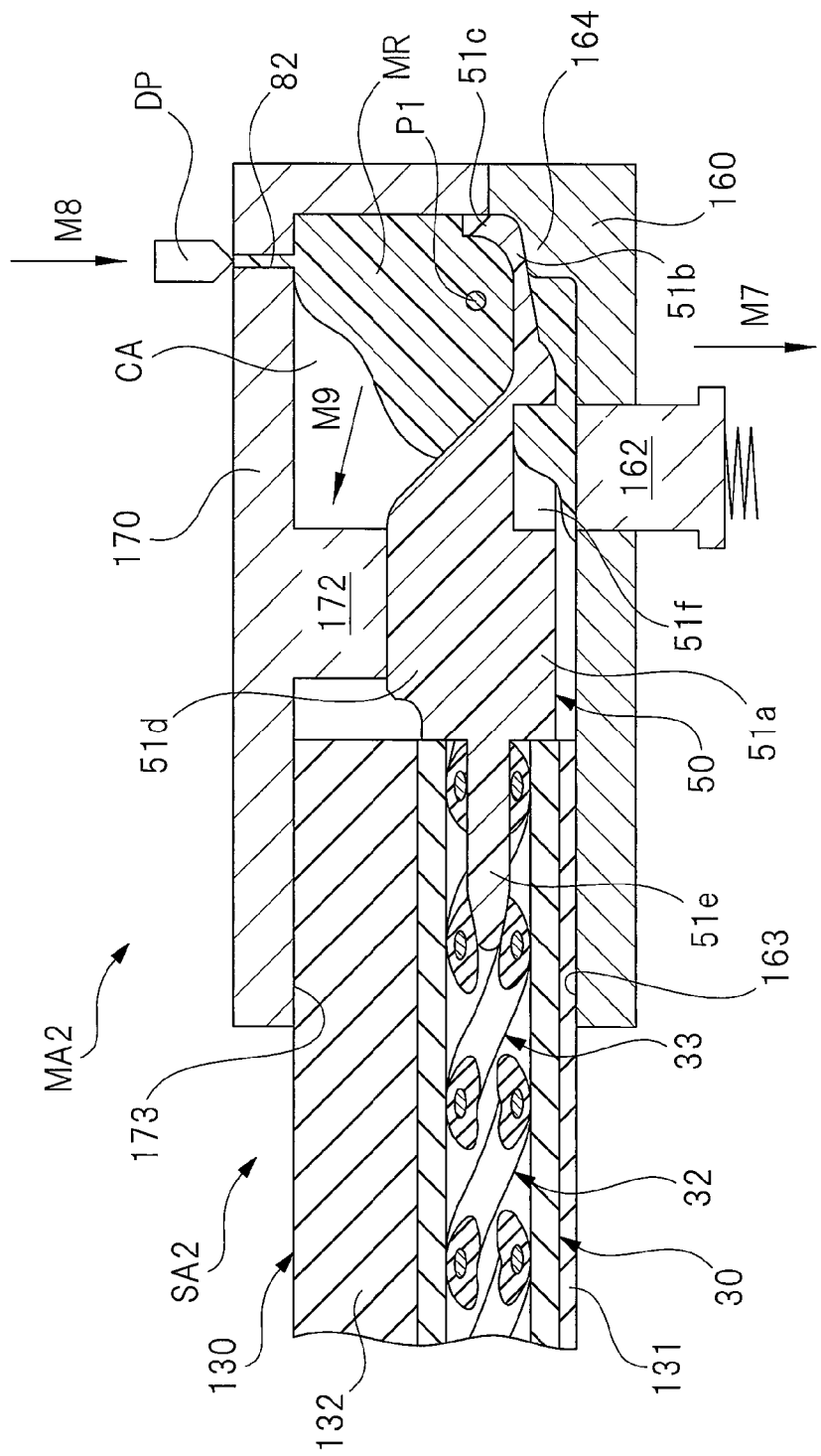
FIG. 20 is a cross-sectional view for describing a third manufacturing process of the tip part of the touch sensor unit for a PTG.

FIG. 18 is a cross-sectional view for describing a first manufacturing process of a tip part of the touch sensor unit for a PTG, FIG. 19 is a cross-sectional view for describing a second manufacturing process of the tip part of the touch sensor unit for a PTG, and FIG. 20 is a cross-sectional view for describing a third manufacturing process of the tip part of the touch sensor unit for a PTG.

The first molded resin part 140 (see FIG. 16) forming the tip part of the touch sensor unit 120 for a PTG is formed using an injection molding device MA2 as illustrated in FIG. 18. Before the molding procedure of the first molded resin part 140 is described, structures of the lower mold 160 and the upper mold 170 forming the injection molding device MA2 will be described.

The injection molding device MA2 has the lower mold (first mold) 160 that is fixed to a base which is not illustrated. The lower mold 160 has a first concave part 161 in which a sub-assembly SA2 is housed with a predetermined gap. Here, the sub-assembly SA2 refers to an assembled state in which the resistor R, the pair of caulking members SW, and the first separator 50 are assembled into the tip parts of the sensor unit 30 and the sensor holder 130 as illustrated in FIG. 18.

A movable protrusion (a movable engaged part) 162 which is inserted into the recess part 51$f$ of the first separator 50 is provided in the first concave part 161 of the lower mold 160. The movable protrusion 162 can freely advance and retract from the bottom of the first concave part 161 to the upper mold 170 due to a drive mechanism, which is not illustrated. In addition, the movable protrusion is inserted into the recess part 51$f$ almost perfectly without rattling.

As described above, since the recess part 51$f$ and the movable protrusion 162 that are engaged with each other extend each in the direction intersecting the longitudinal direction of the first separator 50 and a cross-section of the first separator 50 in the longitudinal direction is a non-circular shape, the first separator 50 can be supported by the lower mold 160 with good accuracy without rattling, and thus the first separator 50 can be easily set in the lower mold 160.

Here, when the sub-assembly SA2 is set in the lower mold 160, the movable protrusion 162 is fixed to the lower mold 160 while protruding thereinto as illustrated in FIG. 18. Accordingly, the movable protrusion 162 can be easily inserted into the recess part 51$f$.

A first holding concave part 163 that holds the periphery of the tip part of the sensor holder 130 with tight attachment is further provided in the lower mold 160. Accordingly, it prevents the molten resin MR (see FIG. 20) filled into the cavity CA (see FIG. 20) from leaking to the outside in the state in which the lower mold 160 is butted against the upper mold 170.

In addition, an abutting protrusion 164 on which a tip part of the second bottom wall part 51$b$ of the first separator 50 abuts is provided in the lower mold 160. The abutting protrusion 164 is disposed in the shallowest portion (the right side in the drawing) of the first concave part 161.

The injection molding device MA2 has the upper mold (second mold) 170 lifted and lowered by a lifting mechanism which is not illustrated. The upper mold 170 has a second concave part 171 in which the sub-assembly SA2 is housed with a predetermined gap. A support protrusion 172 protruding toward the lower mold 160 with a predetermined height is provided in the second concave part 171. This support protrusion 172 is designed to support the partition wall 51$d$ of the first separator 50. Accordingly, the first separator 50 is supported by the upper mold 170 without rattling in the state in which the upper mold 170 is butted against the lower mold 160.

In addition, a second holding concave part 173 that holds the periphery of the tip part of the sensor holder 130 with tight attachment is provided in the upper mold 170. Accordingly, it prevents the molten resin MR filled into the cavity CA from leaking to the outside in the state in which the upper mold 170 is butted against the lower mold 160.

[First Manufacturing Process]

First, the sub-assembly SA2 that has been assembled in a separate manufacturing process is prepared as illustrated in FIG. 18. Next, the first separator 50 side of the sub-assembly SA2 is set to face the lower mold 160. Then, the sub-assembly SA2 is moved and the movable protrusion 162 is inserted into the recess part 51$f$, as indicated by the solid arrow M5. Then, the movable protrusion 162 that has been fixed to the lower mold 160 is completely inserted into the recess part 51$f$, the second bottom wall part 51$b$ is supported by the abutting protrusion 164, and then the periphery of the tip part of the sensor holder 130 is tightly attached to the first holding concave part 163.

Accordingly, the setting of the sub-assembly SA2 into the lower mold 160 is completed. That is, a part of one side of the first separator 50 in the direction intersecting the longitudinal direction (the recess part 51$f$ and the second bottom wall part 51$b$) is supported by the lower mold 160, and thereby the first manufacturing process (first process) is completed.

[Second Manufacturing Process]

Next, the lifting mechanism (not illustrated) of the injection molding device MA2 is driven to bring the upper mold 170 in contact with the lower mold 160 as indicated by the solid arrow M6 of FIG. 19.

Accordingly, the partition wall 51$d$ of the first separator 50 is supported by the support protrusion 172 of the upper mold 170, and the periphery of the tip part of the sensor holder 130 is tightly attached to the second holding concave part 173 as illustrated in FIG. 20. That is, a part of the other side of the first separator 50 in the direction intersecting the longitudinal direction (the partition wall 51$d$) is supported by the upper mold 170, and thereby the second manufacturing process (second process) is completed.

Therefore, the cavity CA to form the first molded resin part 140 (see FIG. 16) is formed between the first concave part 161 of the lower mold 160 and the second concave part 171 of the upper mold 170. At this time, the first separator 50 is sandwiched between the molds 160 and 170 so as to be stably fixed thereinto without rattling in the state in which the upper mold 170 is brought in contact with the lower mold 160.

Specifically, since the first separator 50 as well as the second bottom wall part 51b excluding the recess part 51f is supported by the abutting protrusion 164 of the lower mold 160, support of the first separator 50 by the movable protrusion 162 is unnecessary in the state in which the upper mold 170 is brought in contact with the lower mold 160. Thus, after the upper mold 170 is brought in contact with the lower mold 160, the movable protrusion 162 is driven to be lowered, and accordingly, the insertion (engagement) of the movable protrusion 162 into the recess part 51f is released as indicated by the solid arrow M7 of FIG. 20. A movement amount of the movable protrusion 162 at this time is set to the movement amount of the tip face of the movable protrusion 162 leveled with the bottom face of the first concave part 161 as illustrated in FIG. 20.

Accordingly, the portions of the lower mold 160 and the upper mold 170 in contact with the first separator 50, i.e., portions of the abutting protrusion 164 and the support protrusion 172, are exposed to outside of the first molded resin part 140.

[Third Manufacturing Process]

Next, in a state in which the movable protrusion 162 is receded (a state in which engagement thereof with the recess part 51f is released), a dispenser DP is driven to transfer the molten resin MR to a flow passage 82 at a predetermined pressure as indicated by the solid arrow M8 as illustrated in FIG. 20. Then, the molten resin MR flows into the cavity CA formed in the pair of molds 160 and 170, and then the cavity CA is filled with the molten resin MR as indicated by the solid arrow M9. At this time, since the molten resin MR is transferred to the cavity CA, the molten resin MR spreads to corners of the cavity CA. Accordingly, the first molded resin part 140 is formed, and thereby the third manufacturing process (third process) is completed.

Then, the hardened the first molded resin part 140 is released from the pair of molds 160 and 170. Accordingly, touch sensor unit 120 for a PTG with the eighth exposed part E8 and the ninth exposed part E9 is completed as illustrated in FIG. 16.

As described above, in the touch sensor unit 120 for a PTG of Embodiment 2, the recess part 51f is not exposed to outside, unlike Embodiment 1. That is, in Embodiment 2, the recess part 51f is used only when the sub-assembly SA2 is set into the lower mold 160, and is filled with the resin material after the first molded resin part 140 is molded.

As described above in detail, the same effects as the above-described Embodiment 1 can also be exhibited in Embodiment 2. In addition, portions of the first separator 50 to be exposed to outside can be reduced further in Embodiment 2 than in Embodiment 1. Therefore, the appearance of the touch sensor unit 120 for a PTG can be improved, and insertion components inside the first molded resin part 140 can be protected more reliably.

Note that, although a hole HL formed due to the support protrusion 172 of the upper mold 170 is formed in the first molded resin part 140 as illustrated in FIG. 16(a), the hole HL is shielded by the double-sided tape 133. Therefore, it is possible to prevent rainwater, dust, or the like from reaching the insertion components inside the first molded resin part 140.

It is a matter of course that the disclosure is not limited to the above-described embodiments and can be variously modified within the scope not departing from the gist of the disclosure. For example, although the example in which the pair of electrodes 32 and 33 are fixed into the insulation tube 31 in the spiral shape has been introduced in each of the embodiments, the disclosure is not limited thereto, and four, six, or more electrodes may be provided in a spiral shape or in parallel with each other in accordance with thicknesses of the electrodes, required detection performance, or the like.

In addition, although the example in which the touch sensor unit is fixed to the sliding door 13 or the tailgate 102 of the vehicle 10 has been introduced in each of the above-described embodiments, the disclosure is not limited thereto, and it can be fixed to the sun-roof or the body side of the vehicle. Furthermore, the disclosure is not limited to application to the vehicle 10, and can also be applied to an automatic door device for opening and closing an entrance of a building, and the like.

The disclosure provides a touch sensor unit and a manufacturing method thereof that can reduce variation in products and bring a satisfactory yield by improving the molding accuracy of a terminal part.

A touch sensor unit according to the disclosure is a touch sensor unit that is used to detect a contact of an obstacle including a hollow insulation tube that is elastically deformed by application of an external force, a plurality of electrodes that are provided in the insulation tube and come in contact with each other due to elastic deformation of the insulation tube, an insulation member that is provided at end parts of the plurality of electrodes in a longitudinal direction thereof and prevents the plurality of electrodes from short-circuiting each other, and a terminal part that is provided on an end part of the insulation tube in a longitudinal direction thereof and covers the insulation member, in which a part of the insulation member on one side in a direction intersecting the longitudinal direction thereof and another part of the insulation member on the other side in the direction intersecting the longitudinal direction thereof are each exposed to outside.

In an embodiment of the disclosure, an engagement part extending in the direction intersecting the longitudinal direction of the insulation member and having a non-circular cross-sectional shape in the longitudinal direction of the insulation member is provided in the insulation member.

A manufacturing method of a touch sensor unit according to the disclosure is a manufacturing method of a touch sensor unit that is used to detect a contact of an obstacle, in which the touch sensor unit includes a hollow insulation tube that is elastically deformed by application of an external force, a plurality of electrodes that are provided in the insulation tube and come in contact with each other due to elastic deformation of the insulation tube, an insulation member that is provided on end parts of the plurality of electrodes in a longitudinal direction thereof and prevents the plurality of electrodes from short-circuiting each other, and a terminal part that is provided at an end part of the insulation tube in a longitudinal direction thereof and covers the insulation member, and the terminal part is formed through a first process of supporting a part of the insulation member on one side in a direction intersecting the longitudinal direction by a first mold, a second process of butting a second mold against the first mold and supporting another part of the insulation member on the other side in the direction intersecting the longitudinal direction thereof by the second mold, and a third process of flowing molten resin into an inside formed by the first mold and the second mold.

In an embodiment of the disclosure, an engagement part extending in a direction intersecting a longitudinal direction of the insulation member and having a non-circular cross-sectional shape in the longitudinal direction of the insulation member is provided in the insulation member, and in the first process, the engagement part is engaged with a fixed engaged part provided in the first mold.

In an embodiment of the disclosure, an engagement part extending in the direction intersecting the longitudinal direction of the insulation member and having a non-circular cross-sectional shape in the longitudinal direction of the insulation member is provided in the insulation member, the engagement part is engaged with a movable engaged part provided in the first mold in the first process, and the molten resin flows into the inside formed by the first mold and the second mold in a state in which the engagement of the movable engaged part with the engagement part is released in the third process.

In an embodiment of the disclosure, a portion other than the engagement part of the insulation member is also supported by the first mold in the first process.

According to the disclosure, the insulation member (insertion component) for preventing the plurality of electrodes from short-circuiting each other is provided on the end parts of the plurality of electrodes in the longitudinal direction, the terminal part that covers the insulation member is provided on the end part of the insulation tube in the longitudinal direction, and the part of the insulation member on one side in the direction intersecting the longitudinal direction and the other part of the insulation member on the other side in the direction intersecting the longitudinal direction are each exposed to outside.

Accordingly, when the insulation member is embedded in the terminal part through insert molding or the like, the insulation member can be supported by a mold on one side and a mold on the other side, and the portions of the insulation member supported by the molds at that time are portions exposed to outside.

Therefore, a molten resin or the like for forming the terminal part can be injected into the molds at a predetermined pressure without a concern for misalignment of the insulation member with the terminal part. Thus, manufacturing processes can be simplified, molding accuracy of the terminal part can be improved, further occurrence of variation in products can be reduced, and a yield can be enhanced.

In addition, a material, a shape, a size, the number, an installation place, and the like of each constituent element in each of the above-described embodiments are arbitrary as long as the disclosure can be achieved with them, and not limited to those of the embodiments.

It will be apparent to those skilled in the art that various modifications and variation can be made to the disclosed embodiments without departing from the scope or spirit of the disclosure. In view of the foregoing, it is intended that the disclosure covers modifications and variation provided that they fall within the scope of the following claims and their equivalents.

What is claimed is:

1. A touch sensor unit that is used to detect a contact of an obstacle, the touch sensor unit comprising:
    a hollow insulation tube that is elastically deformed by application of an external force;
    a plurality of electrodes that are provided in the insulation tube and come in contact with each other due to elastic deformation of the insulation tube;
    an insulation member that is provided on end parts of the plurality of electrodes in a longitudinal direction of the electrodes and prevents the plurality of electrodes from short-circuiting each other; and
    a molded resin part that is provided on an end part of the insulation tube in a longitudinal direction of the insulation tube and covers the insulation member,
    wherein the insulation member comprises a housing body part which is formed in a substantial bath tub shape, and a tip side of the housing body part becomes tapered in the longitudinal direction,
    wherein the housing body part comprises a first bottom wall part disposed on a proximal end side in the longitudinal direction, a second bottom wall part disposed on the tip side in the longitudinal direction and a side wall part integrally disposed around the first bottom wall part and the second bottom wall part to stand up with respect to the first bottom wall part and the second bottom wall part,
    wherein a recess part receding toward an inner side from an outer side of the housing body part is provided in the first bottom wall part and exposed to outside from the molded resin part, and exposed parts provided on the second bottom wall part and a partition wall part provided in the housing body part are exposed to outside from the molded resin part.

2. The touch sensor unit according to claim 1,
    wherein an engagement part extending in the direction intersecting the longitudinal direction of the insulation member and having a non-circular cross-sectional shape in the longitudinal direction of the insulation member is provided in the insulation member.

* * * * *